(12) United States Patent
Numano

(10) Patent No.: US 6,906,573 B2
(45) Date of Patent: Jun. 14, 2005

(54) SEMICONDUCTOR CIRCUIT AND PHOTOCOUPLER

(75) Inventor: Masaru Numano, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 10/401,681

(22) Filed: Mar. 31, 2003

(65) Prior Publication Data

US 2003/0197992 A1 Oct. 23, 2003

(30) Foreign Application Priority Data

Apr. 5, 2002 (JP) .................................. 2002-104308

(51) Int. Cl.$^7$ .................. H03K 5/08; H03K 17/687; H03L 5/00
(52) U.S. Cl. .................. 327/309; 327/434; 327/437; 361/91.1; 361/91.5
(58) Field of Search ............................... 327/309, 312, 327/314, 325, 427, 430–437, 514; 250/551; 361/91.1, 91.5

(56) References Cited

U.S. PATENT DOCUMENTS

| | | | | |
|---|---|---|---|---|
| 5,357,393 A | * | 10/1994 | Mojaradi et al. | 361/56 |
| 5,418,381 A | * | 5/1995 | Aizawa | 250/551 |
| 5,475,333 A | * | 12/1995 | Kumagai | 327/530 |
| 6,111,454 A | * | 8/2000 | Shinohe et al. | 327/530 |
| 6,160,694 A | | 12/2000 | Crespi et al. | 361/111 |
| 6,456,474 B2 | * | 9/2002 | Yasumori | 361/91.5 |

FOREIGN PATENT DOCUMENTS

JP        11-283773        10/1999

* cited by examiner

Primary Examiner—Tuan T. Lam
(74) Attorney, Agent, or Firm—Oblon, Spivak, McClelland, Maier & Neustadt, P.C.

(57) ABSTRACT

A semiconductor circuit disclosed herein includes a first output MOS transistor which includes a first terminal connected to a first power source and a second terminal connected to an output terminal to be connected to a load circuit; a second output MOS transistor which includes a third terminal connected to a second power source and a fourth terminal connected to the output terminal; a first functional block circuit which is connected between a control terminal of one of the first output MOS transistor and the second output MOS transistor and the output terminal, wherein the first functional block circuit includes at least one first diode, the first diode being a CB shorted NPN transistor or a CB shorted LPNP transistor; and a second functional block circuit which is provided in parallel with the first functional block circuit and includes at least one second diode connected in an opposite direction to the first diode of the first functional block circuit, the second diode being a CB shorted NPN transistor or a CB shorted LPNP transistor.

22 Claims, 19 Drawing Sheets

US 6,906,573 B2

1

SEMICONDUCTOR CIRCUIT AND PHOTOCOUPLER

CROSS REFERENCE TO RELATED APPLICATION

This application claims benefit of priority under 35 U.S.C. § 119 to Japanese Patent Application No. 2002-104308, filed on Apr. 5, 2002, the entire contents of which are incorporated by reference herein.

BACKGROUND OF THE INVENTION

1. Field of the Invention

The present invention relates to a semiconductor circuit and a photocoupler, and particularly relates to a semiconductor circuit and a photocoupler which operate stably.

2. Description of the Related Art

Generally, a power MOS transistor is used in a half-bridge circuit, and a gate-source withstand voltage VGSS and a drain-source withstand voltage VDSS are different in this power MOS transistor. Therefore, it becomes necessary to provide a protection circuit of some kind in the power MOS transistor. Since the gate-source withstand voltage VGSS is generally lower than the drain-source withstand VDSS, it is common to protect a gate insulating film of the power MOS transistor by inserting clamp elements such as Zener diodes in parallel between a gate and a source thereof.

In a discrete IC, the gate of the power MOS transistor is protected by forming a Zener diode made of polysilicon inside the power MOS transistor. In recent years, various manufacturers launch ICs each having a built-in power MOS transistor through an IC process, but the Zener diode made of polysilicon is not used because of a large leakage current, and a normal Zener diode is usually used as a clamp element.

FIG. 1 shows a sectional view of a Zener diode ZD1. As shown in FIG. 1, the Zener diode ZD1 is formed in an N-type element forming region 14 which is isolated by a P-type semiconductor substrate 10 and a P-type isolation diffusion layer 12. By these semiconductor substrate 10 and isolation diffusion layer 12, the Zener diode ZD1 formed in the element forming region 14 is electrically isolated from other elements.

A P-type anode region 20 is formed in the surface side of the element forming region 14 by diffusion process, and a PN junction is formed between this P-type anode region 20 and the N-type element forming region 14. Namely, the N-type element forming region 14 constitutes a cathode region. An anode electrode 22 which electrically connects with the anode region 20 is formed on the surface of the anode region 20. An N⁺-type buried impurity region 24 having a higher concentration than the element forming region 14 is formed between the semiconductor substrate 10 and the element forming region 14. Moreover, an N⁺-type buried impurity region 28 having a higher impurity concentration than the element forming region 14 is formed between the buried impurity region 24 and a cathode electrode 26.

However, the Zener diode ZD1 thus structure parasitically forms a vertical type PNP transistor 30 (hereinafter referred to as a parasitic SubPNP transistor) with the anode region 20, the element forming region 14 and the semiconductor substrate 10 as its emitter, base and collector, respectively. When the cathode electrode 26 has a higher voltage than the anode electrode 22, the Zener diode ZD1 performs a Zener operation, but the parasitic SubPNP transistor 30 does not operate. On the other hand, when the anode electrode 22 has

2 a higher voltage than the cathode electrode 26, the Zener diode ZD1 is turned on as a PN diode, and at the same time, the parasitic SubPNP transistor 30 is also brought into an ON state and operates. As a result, a certain percentage of a current flowing into the anode region 20 leaks to the P-type semiconductor substrate 10.

FIG. 2 is a graph showing the relation between a forward current IF of the Zener diode ZD1 and a subcurrent Isub which flows into the semiconductor substrate 10. FIG. 3 is a circuit diagram showing current measuring points when the forward current IF of the Zener diode ZD1 and the subcurrent Isub are measured, corresponding to the graph in FIG. 2.

From FIG. 2 and FIG. 3, it can be seen that approximately half of the forward current IF flowing through the Zener diode ZD1 leaks to the semiconductor substrate 10 as the subcurrent.

FIG. 4 is a diagram showing an example of a half-bridge circuit in which the Zener diode ZD1 is used as a clamp circuit.

As shown in FIG. 4, a P-type power MOS transistor P1 and ah N-type power MOS transistor N3 are connected at a stage next to a small signal block circuit 41 which treats relatively small signals to constitute a CMOS inverter. Hence, the power MOS transistor P1 and the power MOS transistor N3 complementarily perform on/off operations. Namely, when the power MOS transistor P1 is on, the power MOS transistor N3 is off. Contrary to this, when the power MOS transistor P1 is off, the power MOS transistor N3 is on.

At a stage next to this CMOS inverter, an N-type power MOS transistor N1 as an output element and an N-type power MOS transistor N2 located under the power MOS transistor N1 are connected to thereby constitute a half-bridge output circuit. There is an output terminal Vo between the power MOS transistor N1 and the power MOS transistor N2, and a load circuit is connected to this output terminal. In FIG. 4, this load circuit can be regarded as a load resistance Ro and a load capacitance Co.

A drain of the power MOS transistor N1 is connected, for example, to a supply power source VCC of 30 V, and a source of the power MOS transistor N2 is connected, for example, to a ground GND. The supply power source VCC constitutes a first power source in this embodiment, and the ground GND constitutes a second power source which has a lower voltage than the first power source in this embodiment.

A gate of the power MOS transistor N2 is normally connected to the small signal block circuit 41 via a drive circuit, but in FIG. 4, the drive circuit is omitted. The Zener diode ZD1 is inserted between a gate and a source of the high-side N-type power MOS transistor N1 to connect them.

When the output terminal Vo of the half-bridge circuit in FIG. 4 is high, that is, when the power MOS transistor N1 is on and the power MOS transistor N2 is off, the Zener diode ZD1 performs the Zener operation and it is brought into an on state. Consequently, the gate-source voltage of the power MOS transistor N1 is maintained at a Zener voltage Vz. Incidentally, in this case, the power MOS transistor P1 in the previous stage is on, and the power MOS transistor N3 is off.

Moreover, the Zener diode ZD1 protects the gate of the power MOS transistor N1 also when a signal outputted from the small signal block circuit 41 switches and thereby the output terminal Vo switches from high to low. More specifically, while the voltage of the gate of the power MOS transistor N1 reaches a low level from a high level, both of the power MOS transistors N1 and N2 temporarily become off. While both of these power MOS transistors N1 and N2 are off, the output terminal Vo remains high. Therefore, unless some kind of clamp circuit is inserted between the gate and the source of the power MOS transistor N1, the potential difference between the gate and the source exceeds the gate-source withstand voltage, and thereby a gate insulating film of the power MOS transistor N1 may be destroyed.

In FIG. 4, the Zener diode ZD1 inserted between the gate and the source operates as the PN diode by extracting charge from the load capacitance Co via the load resistance Ro, and the source-gate voltage of the power MOS transistor N1 is maintained at VBE.

However, as described above, when the Zener diode ZD1 operates as a normal diode in the half-bridge circuit in FIG. 4, the parasitic SubPNP transistor 30 operates and thereby part of the current leaks to the semiconductor substrate 10. As shown in FIG. 2, approximately half of the current flowing into the anode electrode 22 leaks to the P-type semiconductor substrate 10.

When the small signal block circuit 41 which operates by small signals is provided at a stage previous to the half-bridge circuit and the small signal block circuit 41 is incorporated in the same IC as shown in FIG. 4, the current which has leaked to the semiconductor substrate 10 changes the GND voltage, whereby there is a possibility of causing the small signal block circuit 41 to malfunction. Furthermore, it is possible that a malfunction signal is outputted from the output terminal Vo to cause a power element at a stage posterior to the half-bridge circuit to malfunction, and that at the worst, the IC or the load circuit is destroyed.

SUMMARY OF THE INVENTION

In order to accomplish the aforementioned and other objects, according to one aspect of the present invention, a semiconductor circuit, comprises: a first output MOS transistor which includes a first terminal connected to a first power source and a second terminal connected to an output terminal to be connected to a load circuit;

a second output MOS transistor which includes a third terminal connected to a second power source having a lower voltage than the first power source and a fourth terminal connected to the output terminal;

a first functional block circuit which is connected between a control terminal of one of the first output MOS transistor and the second output MOS transistor and the output terminal, wherein the first functional block circuit includes at least one first diode, the first diode being a CB shorted NPN transistor which is formed by shorting a collector and a base of an NPN transistor and using the shorted collector and base as an anode and using an emitter as a cathode, or the first diode being a CB shorted LPNP transistor which is formed by shorting a collector and a base of a lateral PNP transistor and using the shorted collector and base as a cathode and using an emitter as an anode; and a second functional block circuit which is provided in parallel with the first functional block circuit and includes at least one second diode connected in an opposite direction to the first diode of the first functional block circuit, the second diode being a CB shorted NPN transistor or a CB shorted LPNP transistor.

According to another aspect of the present invention, a photocoupler, comprises: a first output MOS transistor which includes a first terminal connected to a first power source and a second terminal connected to an output terminal to be connected to a load circuit;

a second output MOS transistor which includes a third terminal connected to a second power source having a lower voltage than the first power source and a fourth terminal connected to the output terminal;

a first functional block circuit which is connected between a control terminal of one of the first output MOS transistor and the second output MOS transistor and the output terminal, wherein the first functional block circuit includes at least one first diode, the first diode being a CB shorted NPN transistor which is formed by shorting a collector and a base of an NPN transistor and using the shorted collector and base as an anode and using an emitter as a cathode, or the first diode being a CB shorted LPNP transistor which is formed by shorting a collector and a base of a lateral PNP transistor and using the shorted collector and base as a cathode and using an emitter as an anode;

a second functional block circuit which is provided in parallel with the first functional block circuit and includes at least one second diode connected in an opposite direction to the first diode of the first functional block circuit, the second diode being a CB shorted NPN transistor or a CB shorted LPNP transistor;

a light-emitting element which emits light by the flow of a current; and a third functional block circuit which supplies a control signal to the control terminals of the first output MOS transistor and the second output MOS transistor and controls on/off state of the first output MOS transistor and the second output MOS transistor, wherein the third functional block circuit includes a photodiode which functions as a light-receiving element and optically couples with the light-emitting element with the photodiode.

DETAILED DESCRIPTION OF THE EMBODIMENTS

[First Embodiment]

Figure 4:
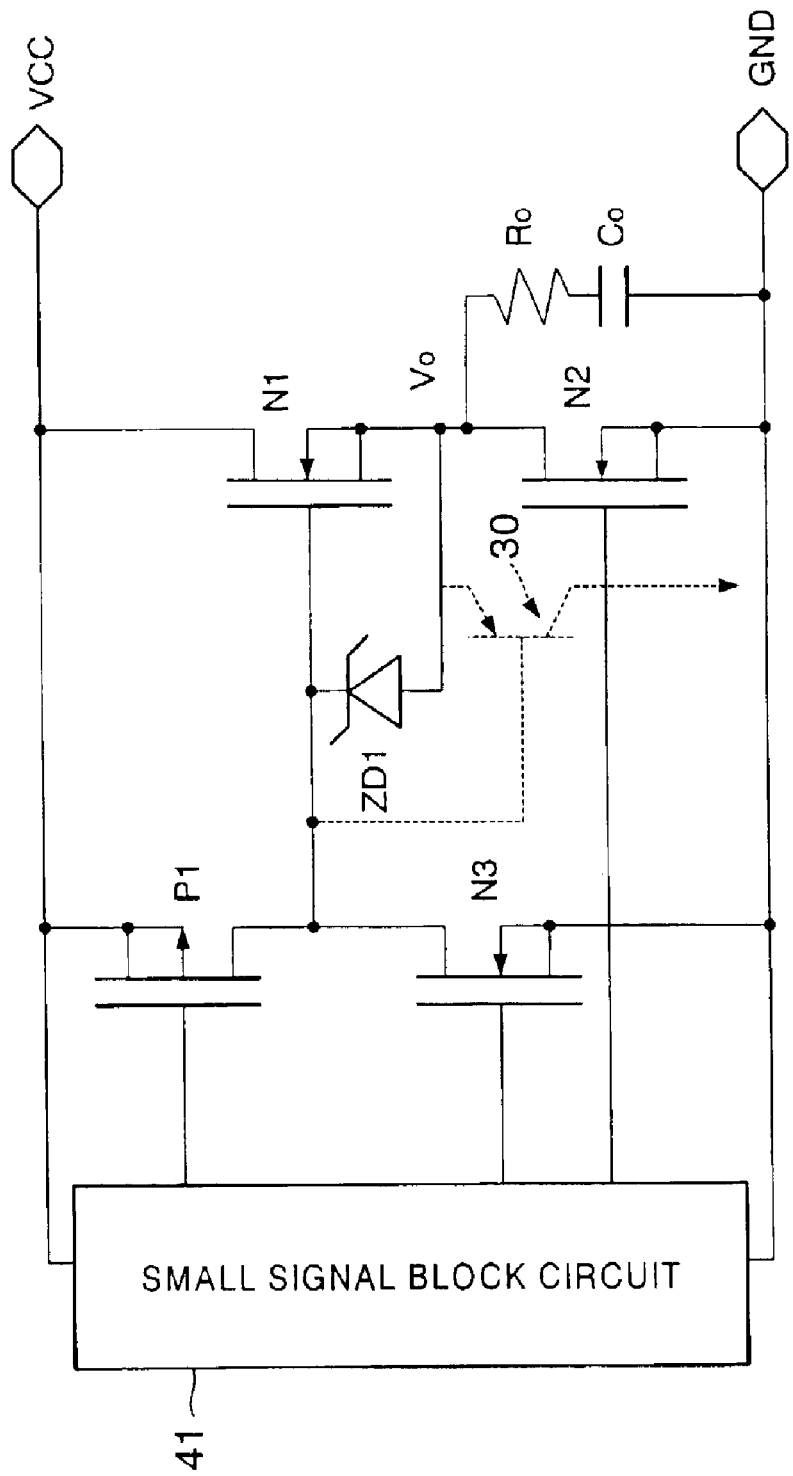
FIG. 4 is a circuit diagram showing the configuration of a related half-bridge circuit.

In a first embodiment, the function of a Zener diode ZD1 in a related half-bridge circuit explained in FIG. 4 is divided into two functions, functional block circuits are separately provided for respective functions, and each of the functional block circuits is formed of an element in which a very small amount of current leaks to a semiconductor substrate. Further details will be given below.

Figure 5:
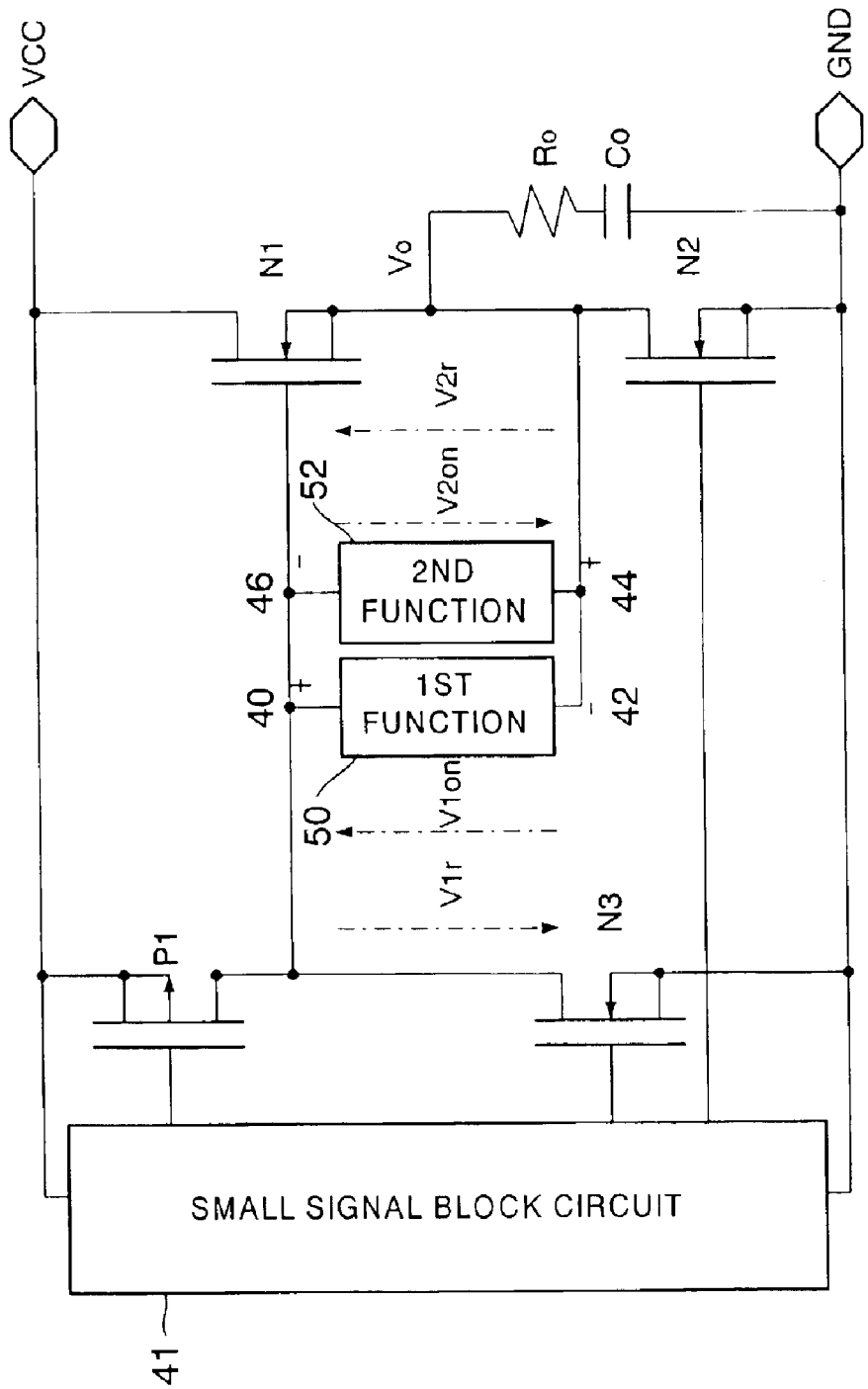
FIG. 5 is a circuit diagram of a half-bridge circuit according to a first embodiment.

FIG. 5 shows a circuit diagram of a half-bridge circuit according to this embodiment. Incidentally, in this embodiment, the same numerals and symbols will be given to the same portions as those of the half-bridge circuit shown in FIG. 4, so that the explanation will be omitted.

As shown in FIG. 5, in the half-bridge circuit according to this embodiment, a first functional block circuit 50 for a function 1 and a second functional block circuit 52 for a function 2 are respectively inserted in parallel between a gate and a source of a power MOS transistor N1. Namely, a plus side terminal 40 of the first functional block circuit 50 is connected to the gate of the power MOS transistor N1, a minus side terminal 42 thereof is connected to the source of the power MOS transistor N1. A plus side terminal 44 of the second functional block circuit 52 is connected to the source of the power MOS transistor N1, and a minus side terminal 46 thereof is connected to the gate of the power MOS transistor N1.

In the following description, the potential difference between the minus side terminal 42 and the plus side terminal 40 when the voltage of the plus side terminal 40 of the first functional block circuit 50 for the function 1 becomes higher than that of the minus side terminal 42 and thereby the first function block circuit 50 operates is taken as V1on. The operation of the first functional block circuit 50 in this case is called a clamp operation.

Contrary to this, the potential difference between the plus side terminal 40 and the minus side terminal 42 when the voltage of the minus side terminal 42 of the first functional block circuit 50 for the function 1 becomes higher than that of the plus side terminal 42 and thereby the first functional block circuit 50 operates is taken as V1r. The operation of the first functional block circuit 50 in this case is called a reverse operation.

Similarly to the first functional block circuit 50, the potential difference between the minus side terminal 46 and the plus side terminal 44 when the voltage of the plus side terminal 44 of the second functional block circuit 50 becomes higher than that of the minus side terminal 46 and thereby the second function block circuit 52 operates is taken as V2on. The operation of the second functional block circuit 52 in this case is called a clamp operation.

Contrary to this, the potential difference between the plus side terminal 44 and the minus side terminal 46 when the voltage of the minus side terminal 46 of the second functional block circuit 52 becomes higher than that of the plus side terminal 44 and thereby the second functional block circuit 52 operates is taken as V2r. The operation of the second functional block circuit 52 in this case is called a reverse operation.

Moreover, the threshold voltage of the power MOS transistor N1 is taken as VthN1, and the gate-source withstand voltage which is the withstand voltage between the gate and the source is taken as VGSSN1. The function 1 and the function 2 in this case can be summarized as follows.

Function 1: When the power MOS transistor N1 is turned on, the potential difference between the gate and the source of this power MOS transistor N1 is maintained at the threshold voltage VthN1 or higher, and at the gate-source withstand voltage VGSSN1 or lower. Accordingly, V1on can be represented by the following relational expression 1.

$$VGSSN1 > V1on > VthN1 \qquad \text{(Relational Expression 1)}$$

Function 2: When the output terminal Vo is switched from high to low, the potential difference of the gate and the source of the power MOS transistor N1 is maintained at the gate-source withstand voltage VGSS or lower. Accordingly, V2on on can be represented by the following relational expression 2.

$$VGSSN1 > V2on \qquad \text{(Relational Expression 2)}$$

When the output terminal Vo is switched from high to low, the half-bridge circuit according to this embodiment operates as follows. First, when the output terminal Vo is high, a signal to turn a P-type power MOS transistor P1 on and a signal to turn an N-type power MOS transistor N3 on are outputted from a small signal block circuit 41. On this occasion, the power MOS transistor N1 is on and a power MOS transistor N2 is off.

In this state, the on/off relation between the power MOS transistors P1 and N3 is switched. Namely, a signal to turn the power MOS transistor P1 off and a signal to turn the power MOS transistor N3 on are outputted from the small signal block circuit 41. Accordingly, the power MOS transistor N1 is turned off.

However, since the signal to turn the power MOS transistor N2 off continues being outputted from the small signal block circuit 41, the power MOS transistor N2 is also turned off. In other words, both of the power MOS transistors N1 and N2 are temporarily turned off. This is because the output terminal Vo cannot be instantaneously switched from high to low since a load circuit considered as a load resistance Ro and a load capacitance Co is connected to the output terminal Vo. Moreover, this is in order to avoid both of the power MOS transistors N1 and N2 from being instantaneously turned on and thereby a through current from flowing to these power MOS transistors N1 and N2 from the side of a supply power source VCC to the side of a ground GND.

After a lapse of a predetermined time since both of the power MOS transistors N1 and N2 were turned off, the output terminal switches from high to low. Hence, after a lapse of the predetermined time, the signal to turn the power MOS transistor N2 on is outputted from the small signal block circuit 41. Consequently, the power MOS transistor N2 is turned on, the power MOS transistor N1 is turned off, and the output terminal Vo becomes low.

In the related half-bridge circuit in FIG. 4, the function 1 is realized by a Zener operation of a Zener diode ZD1, and the function 2 is realized by a diode operation of a PN junction of the same Zener diode ZD1. As a result, during the performance of the function 2, a parasitic element of the Zener diode ZD1 operates. Supposing a parasitic element is provided also in the first functional block circuit 50 for the function 1 and the second functional block circuit 52 for the function 2 according to this embodiment, a subcurrent which leaks to a semiconductor substrate can be reduced if the following constraint conditions are satisfied.

Constraint Condition 1 "In each clamp operation of the first functional block circuit 50 for the function 1 and the second functional block circuit 52 for the function 2, a circuit free of parasitics or with few parasitics is adopted."

Constraint condition 2 "When the first functional block circuit 50 for the function 1 is performing the clamp operation, the second functional block circuit 52 for the function 2 is not allowed to perform the reverse operation, and contrary to this, when the second functional block circuit 52 for the function 2 is performing the clamp operation, the first functional block circuit 50 for the function 1 is not allowed to perform the reverse operation."

Next, the selection of elements to constitute the first functional block circuit 50 and the second functional block circuit 52 will be considered. Generally, an independent element capable of realizing constant voltage by feeding an arbitrary current is a diode of some kind. Namely, there are three kinds: an NPN transistor of which a collector and a base are shorted (hereinafter referred to as a CB shorted NPN transistor), a lateral PNP transistor with the same connection (hereinafter referred to as a CB shorted LPNP transistor), and a Zener diode. They have the following characteristics, respectively.

CB shorted NPN transistor: The subcurrent which leaks to the semiconductor substrate does not substantially exist, but its reverse withstand voltage is low. Its shorted collector and base serve as an anode, and its emitter serves as a cathode.

CB shorted LPNP transistor: Its reverse withstand voltage is high, but since a parasitic SubPNP transistor is contained, a very small amount of subcurrent leaks to its P-type semiconductor substrate. Its shorted collector and base serve as a cathode, and its emitter serves as an anode.

Zener diode: A parasitic SubPNP transistor exists, and when a current flows toward a PN junction, approximately half of the current leaks to the P-type semiconductor substrate.

Figure 6:
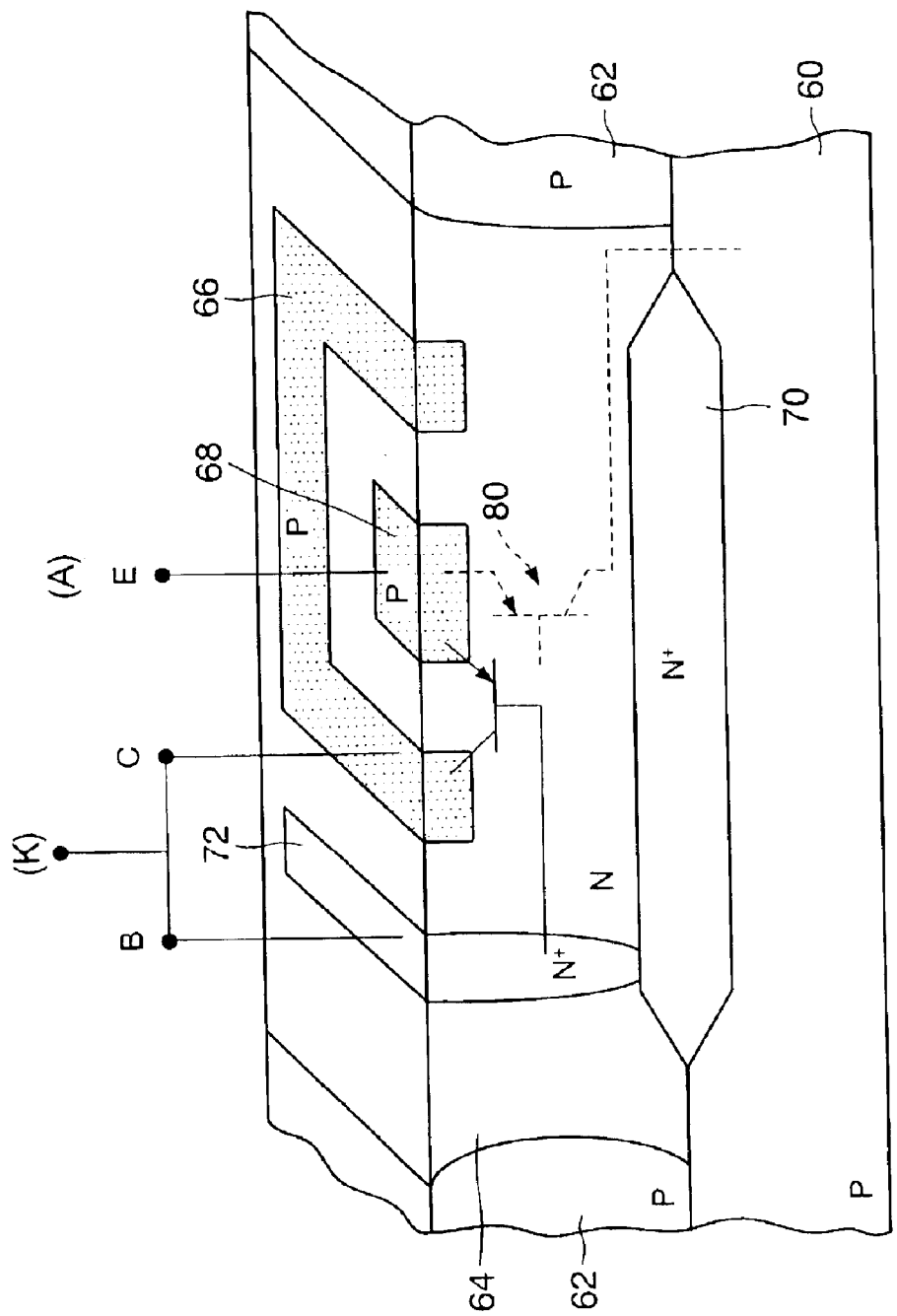
FIG. 6 is a sectional view of a semiconductor device when a diode is formed of a lateral PNP transistor with its base and collector shorted and used as a cathode and its emitter used as an anode.

FIG. 6 shows a sectional view of the CB shorted LPNP transistor. An N-type element forming region 64, which is electrically isolated from other regions by a P-type semiconductor substrate 60 and a P-type isolation diffusion region 62, is formed. A doughnut-shaped P-type collector region 66 is formed in the surface side of the element forming region 64, and a small-sized square P-type emitter region 68 is formed inside the doughnut-shaped collector region 66. A collector electrode C is connected to the surface of this collector region 66, and an emitter region E is connected to the surface of the emitter region 68. The element forming region 64 constitutes the base.

An $N^+$-type buried impurity region 70 having a higher impurity concentration than the element forming region 64 is formed between the P-type semiconductor substrate 60 and the element forming region 64. An $N^+$-type buried impurity region 72 having a higher impurity concentration than the element forming region 64 is formed also between the buried impurity region 70 and the surface of the element forming region 64. A base electrode B is connected to the surface of this buried impurity region 72.

In the lateral PNP transistor shown in FIG. 6, a collector electrode C and the base electrode B are electrically connected, thereby causing a CB short. Therefore, this lateral PNP transistor operates as a diode with the emitter region 68 as an anode region and the element forming region 64 and the buried impurity region 72 as a cathode region.

Moreover, in the lateral PNP transistor shown in FIG. 6, a parasitic SubPNP transistor 80 with the emitter region 68 as its emitter, the element forming region 64 as its base, and the semiconductor substrate 60 as its collector is formed. In this case, if the collector electrode and the base electrode are shorted and an emitter-base PN junction is used as a diode, most of holes flowing through the element forming region 64 as the base region are trapped by the collector region 66. Hence, the subcurrent hardly flows into the P-type semiconductor substrate 60 and the P-type isolation diffusion region 62. Accordingly, the parasitic SubPNP 80 comes to hardly operate.

Figure 7:
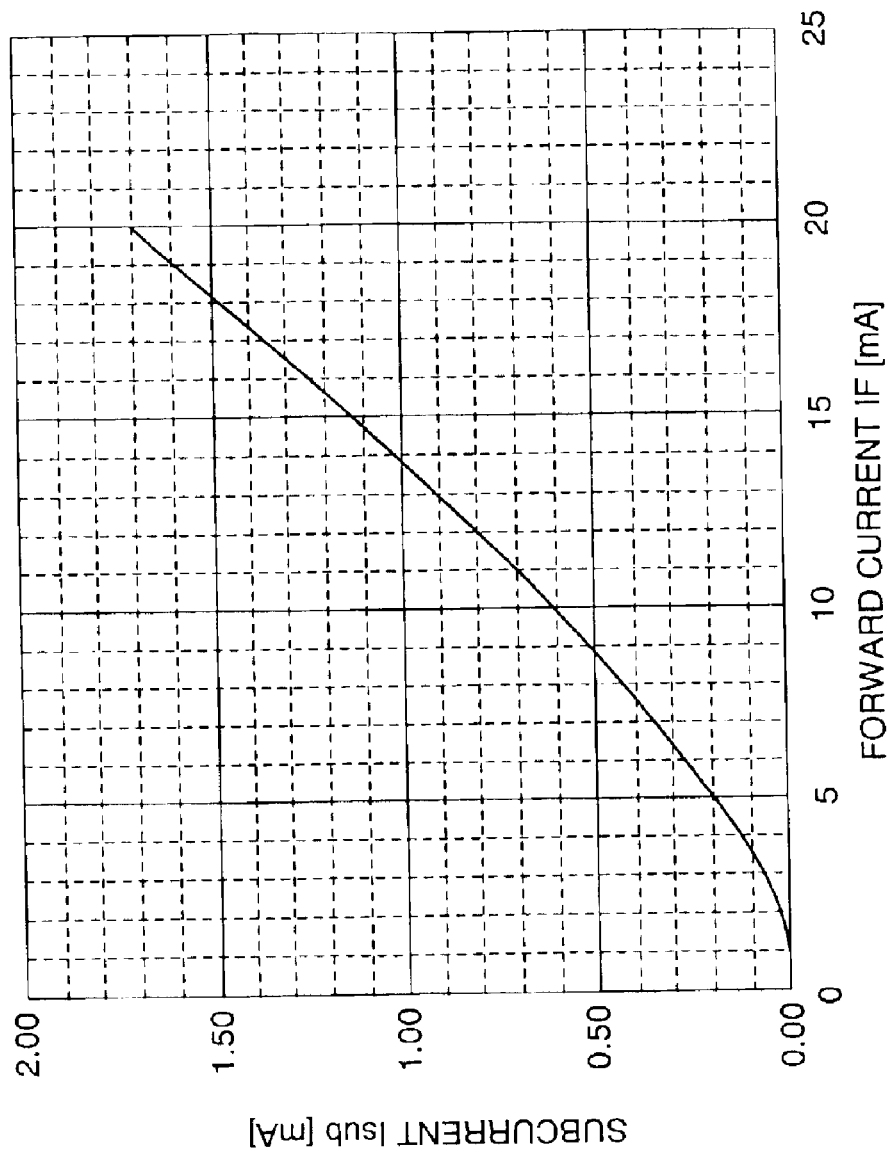
FIG. 7 is a graph showing the relation between a forward current and a subcurrent which leaks to a semiconductor substrate of the diode shown in FIG. 6.
Figure 8:
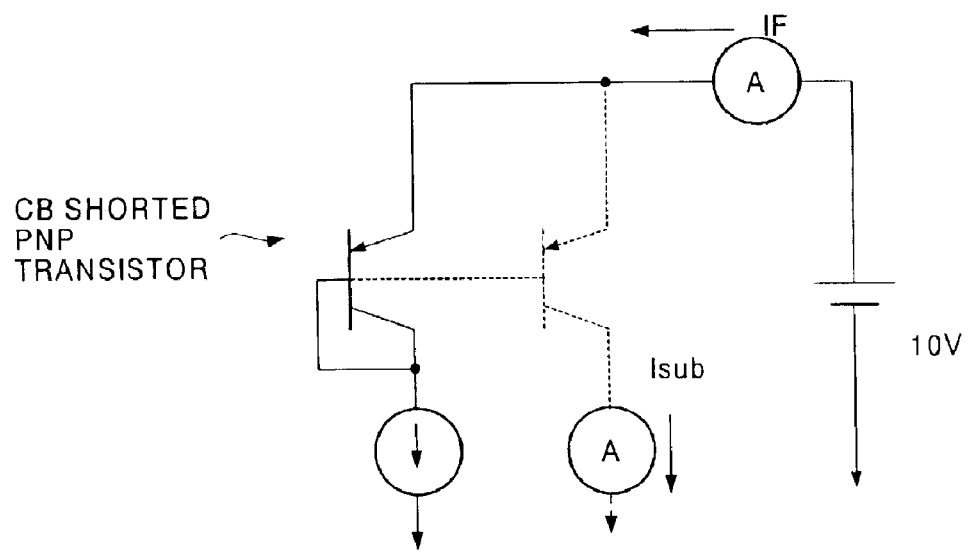
FIG. 8 is a circuit diagram for measuring the forward current and the subcurrent in order to obtain the graph of the diode in FIG. 7.

FIG. 7 is a graph showing the relation between a forward current IF of the diode formed of the CB shorted LPNP transistor shown in FIG. 6 and a subcurrent Isub which flows into the semiconductor substrate 60. FIG. 8 is a circuit diagram showing current measuring points when the forward current IF of the diode formed of the CB shorted LPNP transistor and the subcurrent Isub are measured, corresponding to the graph in FIG. 7.

From FIG. 7 and FIG. 8, it can be seen that the subcurrent Isub which leaks to the semiconductor substrate 60 out of the forward current IF which flows into the diode formed of the CB shorted LPNP transistor is not more than one tenth of the current which flows into the buried impurity region 72.

Figure 9:
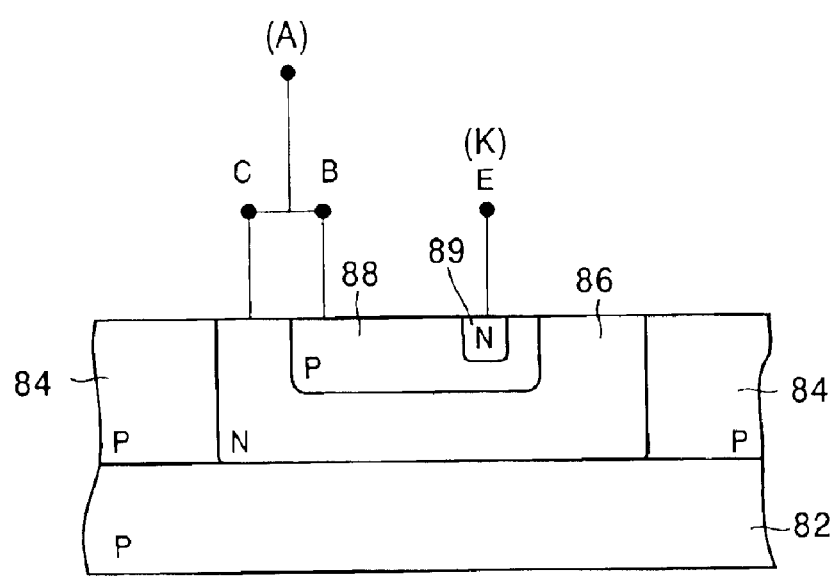
FIG. 9 is a sectional view of a semiconductor device when the diode is formed of an NPN transistor with its base and collector shorted and used as an anode and its emitter used as a cathode.

FIG. 9 is a sectional view of the CB shorted NPN transistor. As shown in FIG. 9, an N-type element forming region 86, which is electrically isolated from other regions by a P-type semiconductor substrate 82 and a P-type isolation diffusion region 84, is formed. This element forming region 86 constitutes a collector region. A P-type base region 88 is formed on the inner surface side of the element forming region 86. An N-type emitter region 89 is formed on the inner surface side of the base region 88.

A collector electrode C is connected to the surface of the element forming region 86 which forms the collector region, a base electrode B is connected to the surface of the base region 88, and an emitter electrode E is connected to the surface of the emitter region 89.

In the NPN transistor shown in FIG. 9, the collector electrode C and the base electrode B are electrically connected, thereby causing a CB short. Therefore, this NPN transistor operates as a diode with the base region 88 as an anode region and the emitter region 89 as a cathode region. Since the CB short is caused as stated above, in the CB shorted NPN transistor shown in FIG. 9, the current which has flowed from the collector region 86 and the base region 88 flows into the emitter region 89 without leaking to the semiconductor substrate 82. In other words, in the CB shorted NPN transistor, in theory, the subcurrent which leaks to the semiconductor substrate 82 does not exist.

It should be noted that generally there exist more precise constant voltage circuits other than the aforementioned elements, but it is unsuitable to use them each as a gate clamp circuit if circuit scale, responsibility, and soon are taken into account.

By arranging each of the aforementioned elements in the first functional block circuit 50 for the function 1 and the second functional block circuit 52 for the function 2, a half-bridge circuit which has few parasitics and operates stably can be constituted.

[Second Embodiment]

In the second embodiment, an example of the concrete circuit configurations of the first functional block circuit 50 and the second functional block circuit 52 in the aforementioned first embodiment is shown.

Figure 10:
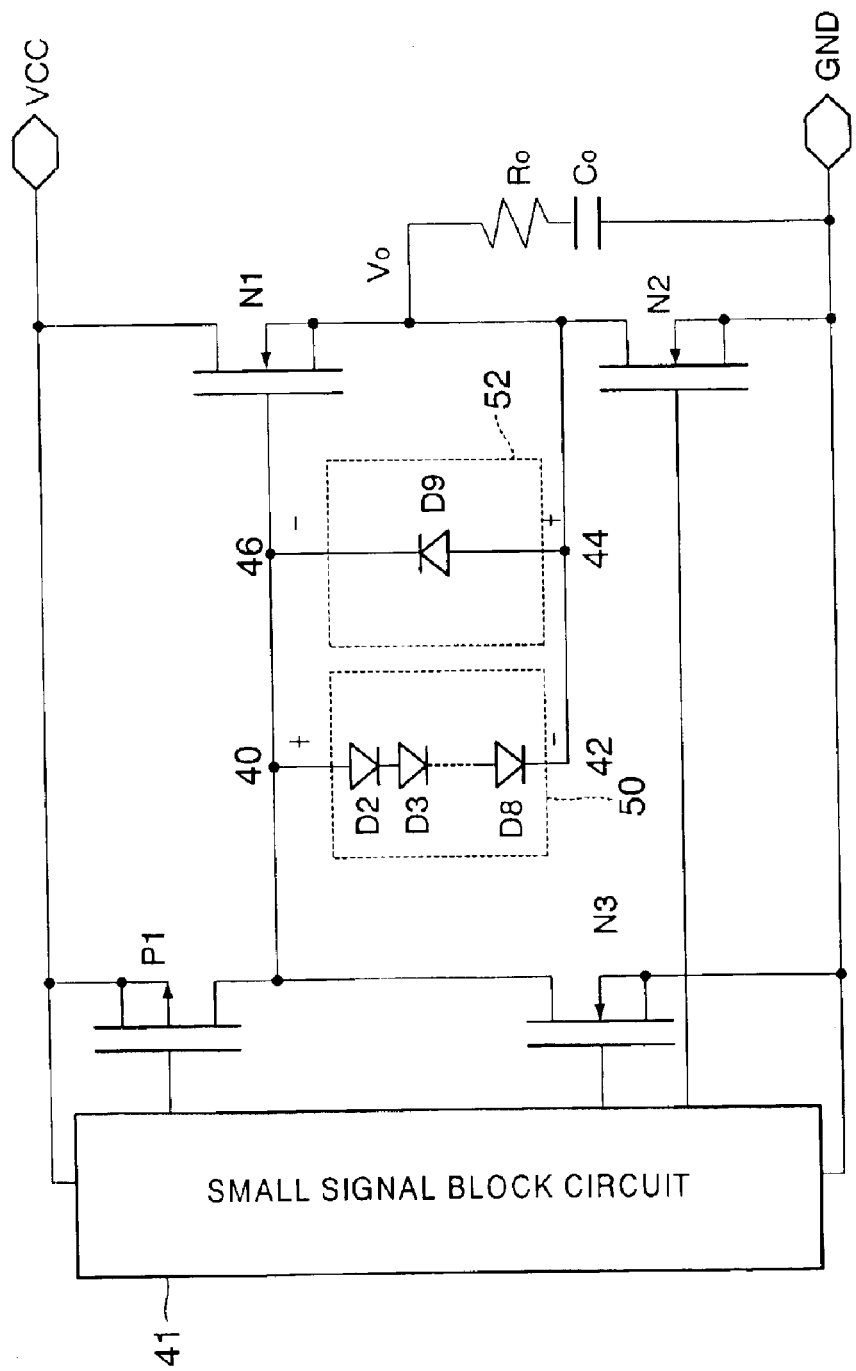
FIG. 10 is a circuit diagram of a half-bridge circuit according to a second embodiment.

FIG. 10 is a diagram showing the circuit configuration of a half-bridge circuit according to this embodiment. In the half-bridge circuit in FIG. 10, the first functional block circuit 50 and the second functional block circuit 52 in the half-bridge circuit according to the first embodiment shown in FIG. 5 are embodied.

As shown in FIG. 10, in this embodiment, the first functional block circuit 50 includes seven diodes D2 to D8 which are connected in series in the same direction. Namely, the seven diodes D2 to D8 whose cathodes are connected to the source side of the power MOS transistor N1 and anodes are connected to the gate side of the power MOS transistor N1 are connected in series.

The second functional block circuit 52 includes one diode D9 which is connected in the opposite direction to the diodes D2 to D8. Namely, one diode whose anode is connected to the source side of the power MOS transistor N1 and cathode is connected to the gate of the power MOS transistor N1 is provided.

Especially in this embodiment, the diodes D2 to D9 are each formed of the CB shorted NPN transistor or the CB shorted LPNP transistor. This is because no subcurrent leaks to the semiconductor substrate in the CB shorted NPN transistor and a very small amount of subcurrent leaks to the semiconductor substrate in the CB shorted LPNP transistor as stated above. The other points are the same as in the aforementioned first embodiment.

Next, the operations of these functional first block circuit 50 and second functional block circuit 52 will be explained. When the output terminal Vo is high, the first functional block circuit 50 operates. Supposing that the base-emitter voltage VBE of each of the seven diodes D2 to D8 is 0.7 V, the potential difference between both ends of the first functional block circuit 50 (potential difference between the minus side terminal 42 and the plus side terminal 40) is 4.9 V. Herein, the gate-source withstand voltage VGSS of the power MOS transistor N1 in this embodiment is, for example, 5 V, and hence the potential difference between the gate and the source can be held to the gate-source withstand voltage VGSS or lower, whereby a gate insulating film of the power MOS transistor N1 can be protected.

In this case, the diode D9 of the second functional block circuit 52 is reverse biased, and thus it does not operate.

On the other hand, when the power MOS transistor P1 is turned off, the power MOS transistor N3 is turned on, the gate of the power MOS transistor N1 becomes low, and both of the power MOS transistors N1 and N2 are turned off, the output terminal Vo still remains high. On this occasion, the diode D9 of the second functional block circuit 52 operates. Therefore, the voltage between the source and the gate of the power MOS transistor N1 can be maintained at 0.7 V that is the base-emitter voltage VBE. Consequently, the gate insulating film of the power MOS transistor N1 can be protected.

In this case, the diodes D2 to D8 of the first functional block circuit 50 are reverse biased, and thus they do not operate.

However, a point to notice is that if the reverse withstand voltage of the diode D9 of the second functional block circuit 52 is 4.9 V or lower while the first functional block circuit 50 operates and performs a clamp operation, the second functional block circuit 52 operates correspondingly. In such a case, it is recommended that the diode D9 be formed of the CB shorted LPNP transistor instead of the CB shorted NPN transistor. This is because the CB shorted LPNP transistor generally has a higher reverse withstand voltage than the CB shorted NPN transistor.

Figure 11:
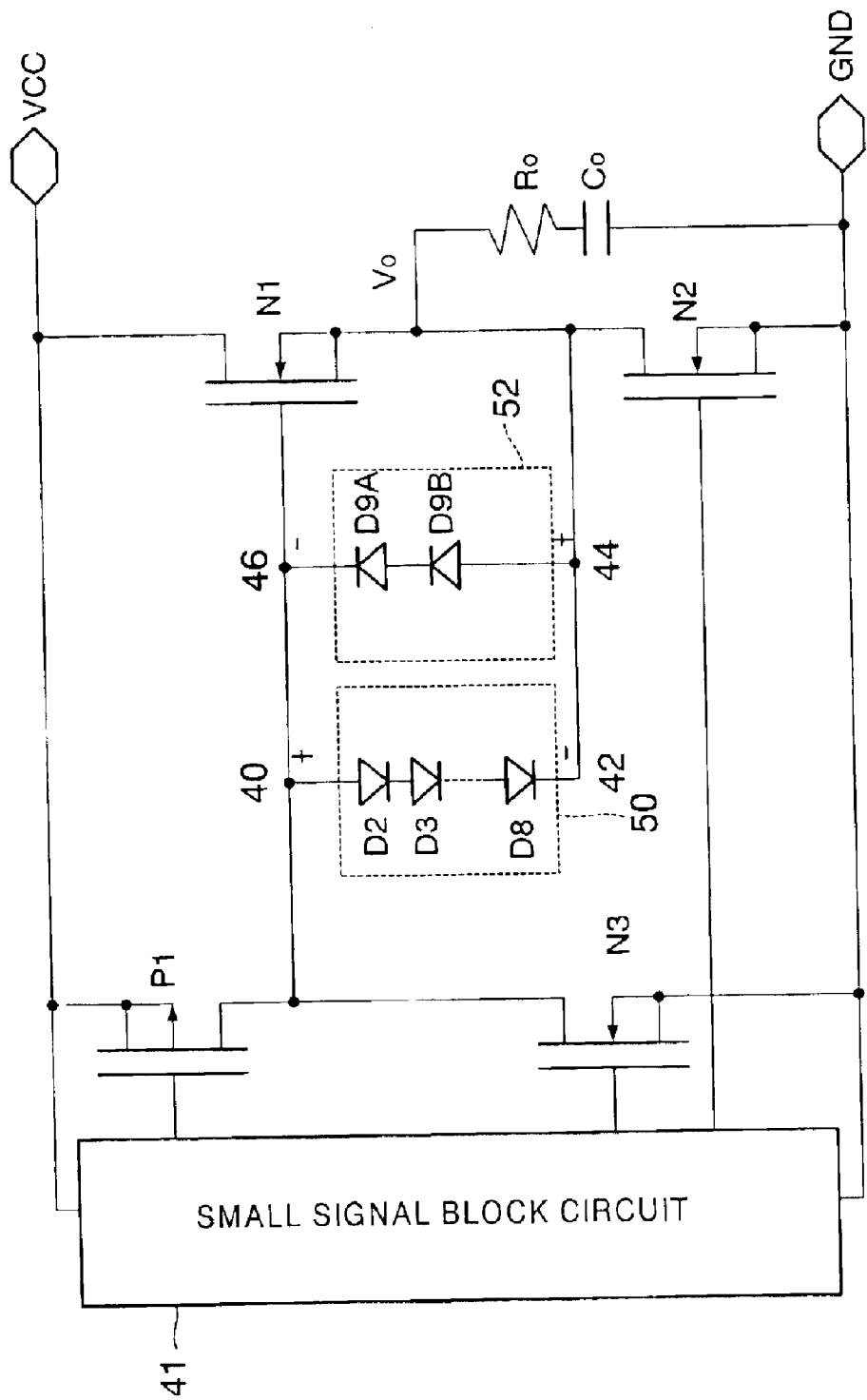
FIG. 11 is a circuit diagram showing a modification of the half-bridge circuit according to the second embodiment.

Moreover, when a sufficient reverse withstand voltage cannot be yet obtained in the above case, it is recommended to connect a plurality of diodes constituting the second functional block circuit 52 in series. For example, as shown in FIG. 11, by providing two diodes D9A and D9B in the second functional block circuit 52 and connecting them in series in the opposite direction to the diodes D2 to D8, the reverse withstand voltage of the second functional block circuit 52 can be increased, thereby allowing the second functional block circuit 52 not to operate while the first functional block circuit 50 operates.

As described above, according to the half-bridge circuit according to this embodiment, the diode D9 is formed by the CB shorted NPN transistor or the CB shorted LPNP transistor, and the second functional block circuit 52 is formed of at least one diode D9, whereby the subcurrent which leaks to the semiconductor substrate can be kept to the minimum possible even when the current flows in the forward direction of the diode D9.

Consequently, it can be avoided that the subcurrent which has leaked to the semiconductor substrate changes the voltage of the ground to thereby instabilize the operation of the half-bridge circuit.

[Third Embodiment]

In the third embodiment, another example of the concrete circuit configurations of the first functional block circuit 50 and the second functional block circuit 52 in the aforementioned first embodiment is shown.

Figure 12:
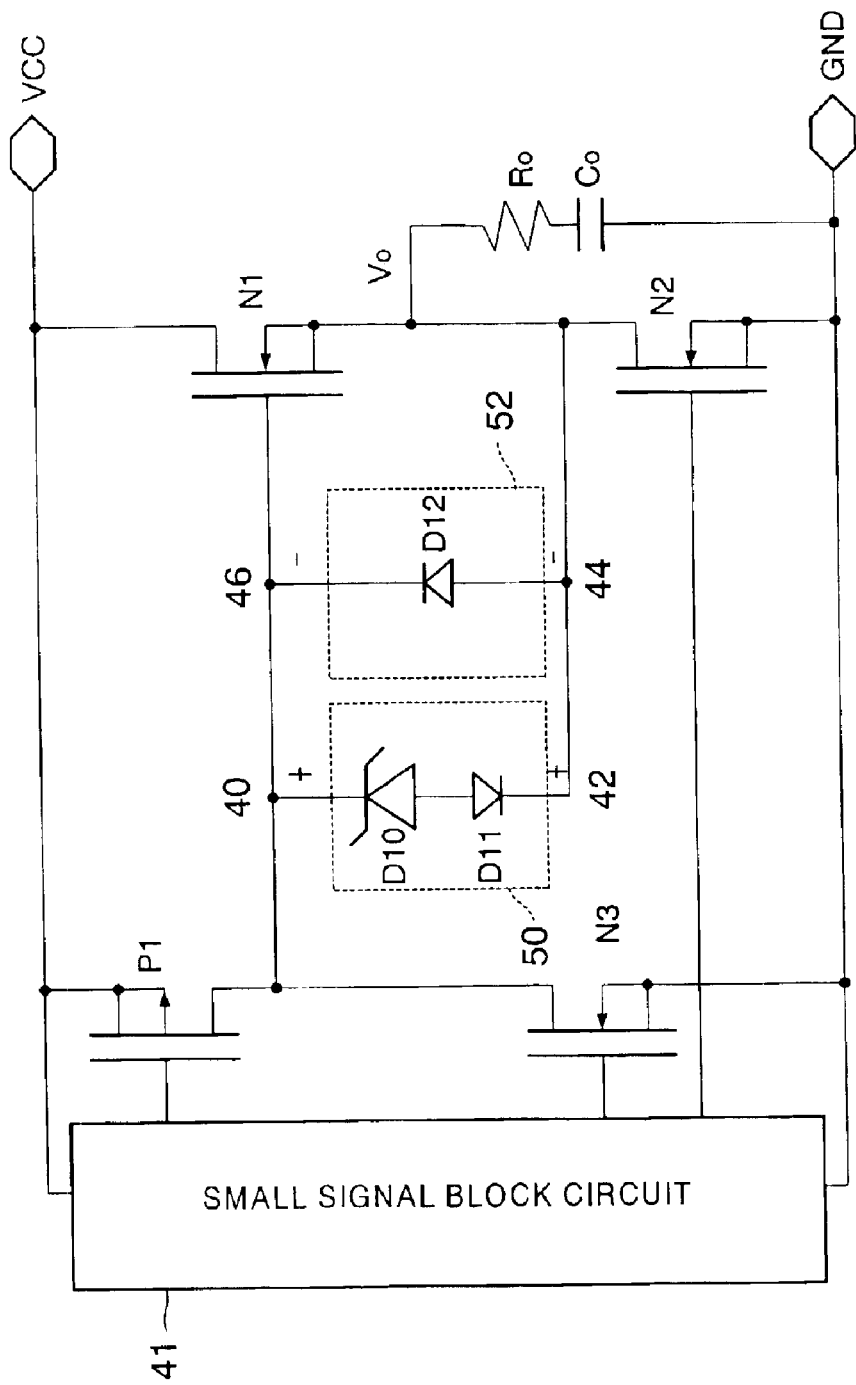
FIG. 12 is a circuit diagram of a half-bridge circuit according to a third embodiment.

FIG. 12 is a diagram showing the circuit configuration of a half-bridge circuit according to this embodiment. In the half-bridge circuit in FIG. 12, the first functional block circuit 50 includes one Zener diode D10 and a diode D11 connected in the opposite direction to the Zener diode D10. Namely, a cathode of the Zener diode D10 is connected to the gate of the power MOS transistor N1, and an anode of the diode D11 is connected to the anode of the Zener diode D10. A cathode of the diode D11 is connected to the source of the power MOS transistor N1.

The second functional block circuit 52 includes one diode D12 which is connected in the opposite direction to the diode D11. Namely, one diode whose anode is connected to the source side of the power MOS transistor N1 and cathode is connected to the gate of the power MOS transistor N1 is provided.

Figure 1:
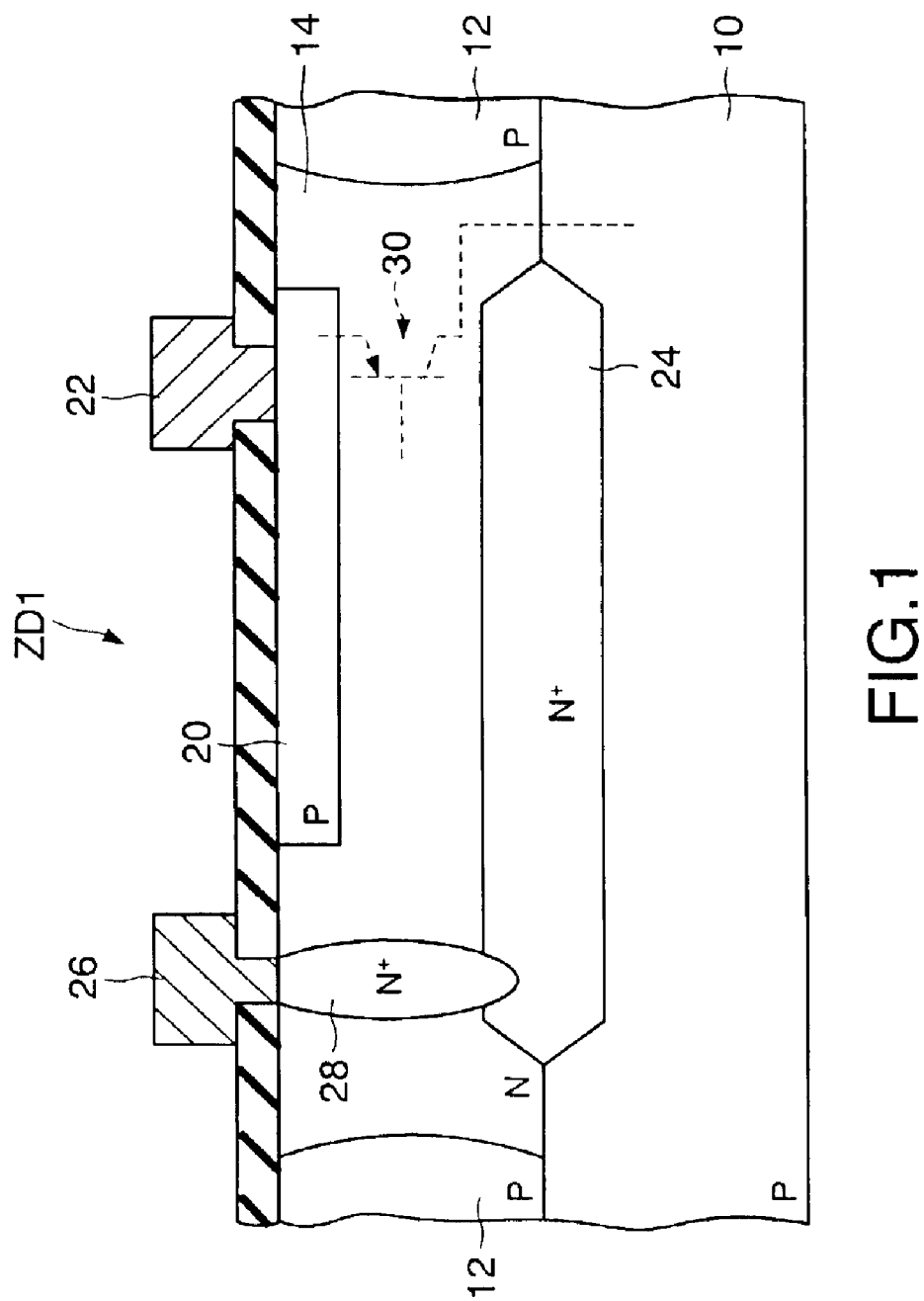
FIG. 1 is a sectional view of a semiconductor for explaining the structure of a common Zener diode.
Figure 2:
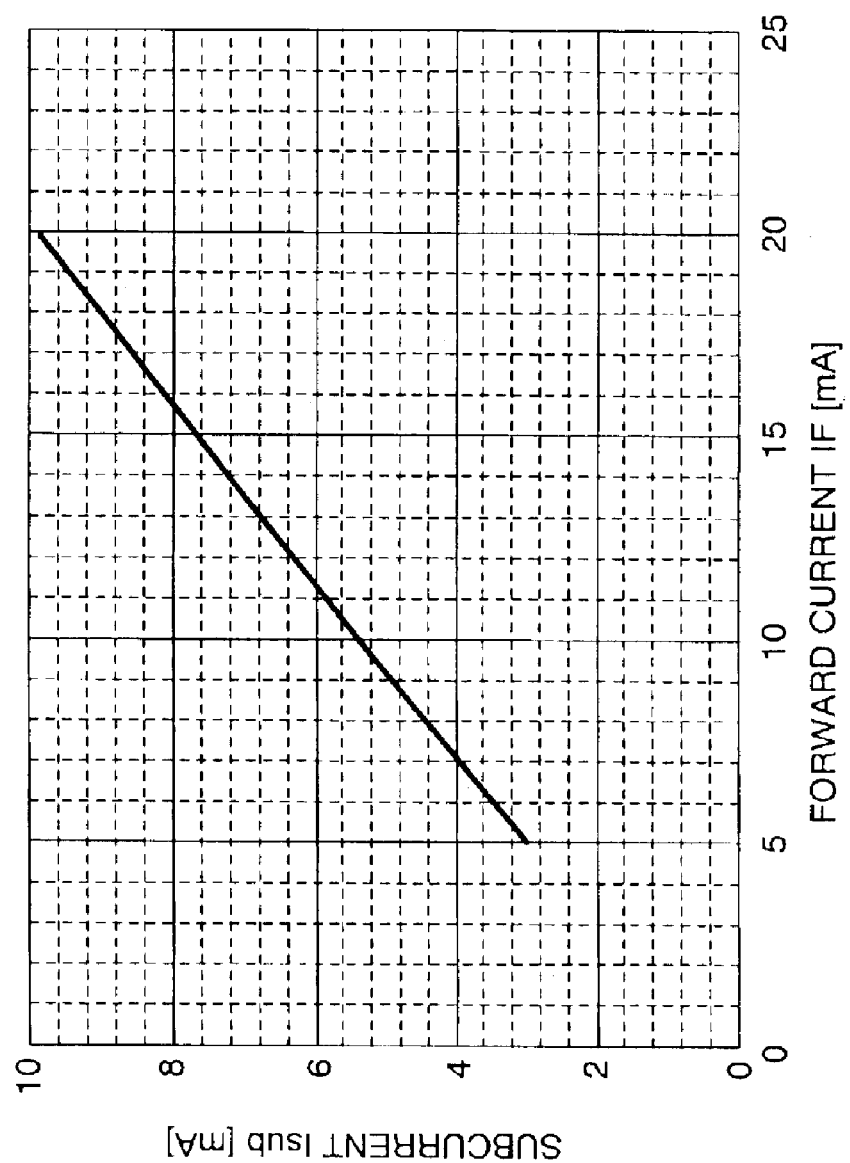
FIG. 2 is a graph showing the relation between a forward current of the Zener diode and a subcurrent which leaks to a semiconductor substrate shown in FIG. 1.
Figure 3:
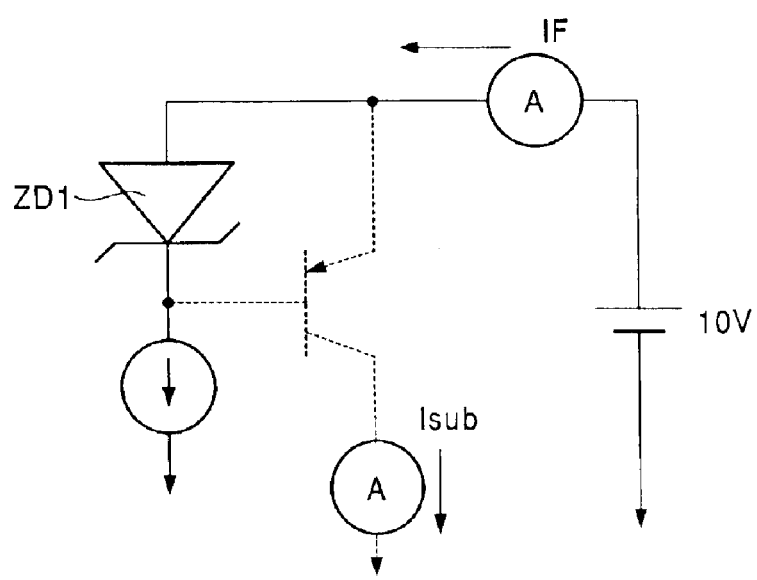
FIG. 3 is a circuit diagram for measuring the forward current and the subcurrent of the Zener diode in order to obtain the graph in FIG. 2.

Especially in this embodiment, the Zener diode D10 is formed of the Zener diode structured as shown in FIG. 1. The diodes D11 and D12 are each formed of the CB shorted NPN transistor or the CB shorted LPNP transistor. The other points are the same as in the aforementioned first embodiment.

Next, the operations of these first functional block circuit 50 and second functional block circuit 52 will be explained. When the output terminal Vo is high, the first functional block circuit 50 operates, and the potential difference between the gate and the drain of the power MOS transistor N1 becomes the sum of a Zener voltage Vz of the Zener diode D10 and the base-emitter voltage VBE of the diode D11. Accordingly, if Vz+VBE is not higher than 5 V which is the gate-source voltage VGSS of the power MOS transistor N1, the gate insulating film of the power MOS transistor N1 can be protected.

In this case, the diode D12 of the second functional block circuit 52 is reverse biased, and thus it does not operate.

On the other hand, when the power MOS transistor P1 is turned off, the power MOS transistor N3 is turned on, the gate of the power MOS transistor N1 becomes low, and both of the power MOS transistors N1 and N2 are turned off, the output terminal Vo still remains high. Therefore, the diode D12 of the second functional block circuit 52 operates. Accordingly, the voltage between the source and the gate of the power MOS transistor N1 can be maintained at 0.7 V that is the base-emitter voltage VBE. Consequently, the gate insulating film of the power MOS transistor N1 can be protected.

In this case, the diode D11 of the first functional block circuit 50 is reverse biased, and thus it does not operate.

However, a point to notice is that if the reverse withstand voltage of the diode D12 of the second functional block circuit 52 is Vz+VBE or lower while the first functional block circuit 50 operates and performs a clamp operation, the second functional block circuit 52 operates correspondingly. In such a case, it is recommended that the diode D12 be formed of the CB shorted LPNP transistor instead of the CB shorted NPN transistor. This is because the CB shorted LPNP transistor generally has a higher reverse withstand voltage than the CB shorted NPN transistor as stated above.

Figure 13:
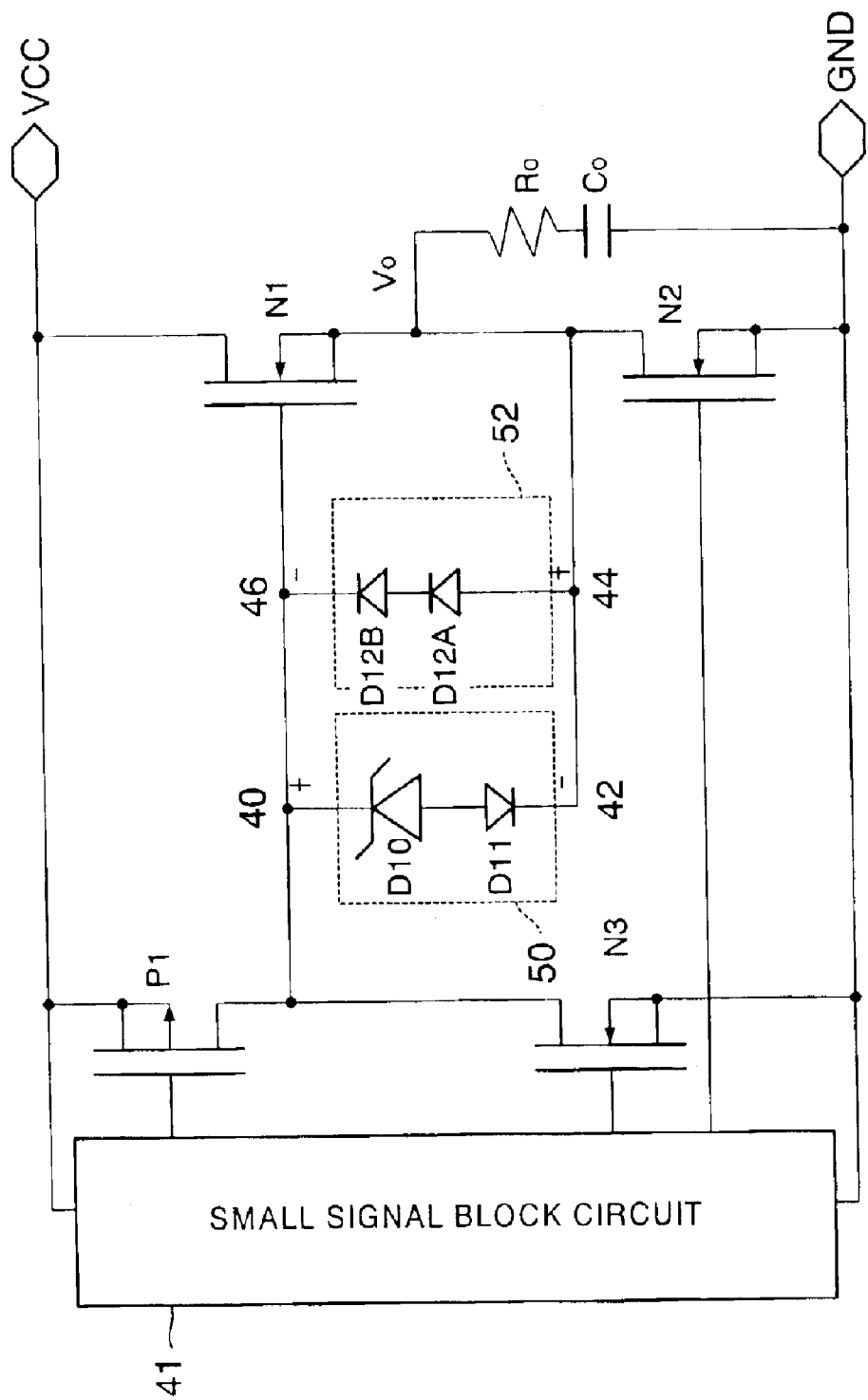
FIG. 13 is a circuit diagram showing a modification of the half-bridge circuit according to the third embodiment.

Moreover, when a sufficient reverse withstand voltage cannot be yet obtained in the above case, it is recommended to connect a plurality of diodes constituting the second functional block circuit 52 in series. For example, as shown in FIG. 13, by providing two diodes D12A and D12B in the second functional block circuit 52 and connecting them in series in the opposite direction to the diode D11, the reverse withstand voltage of the second functional block circuit 52 can be increased, thereby allowing the second functional block circuit 52 not to operate while the first functional block circuit 50 operates.

As described above, according to the half-bridge circuit according to this embodiment, the diode D12 is formed by the CB shorted NPN transistor or the CB shorted LPNP transistor, and the second functional block circuit 52 is formed of at least one diode D12, whereby the subcurrent which leaks to the semiconductor substrate can be kept to the minimum possible even when the current flows in the forward direction of the diode D12.

Consequently, it can be avoided that the subcurrent which has leaked to the semiconductor substrate changes the voltage of the ground to thereby instabilize the operation of the half-bridge circuit.

[Fourth Embodiment]

In the fourth embodiment, a Zener diode is additionally inserted in the second functional block circuit 52 in the aforementioned third embodiment.

Figure 14:
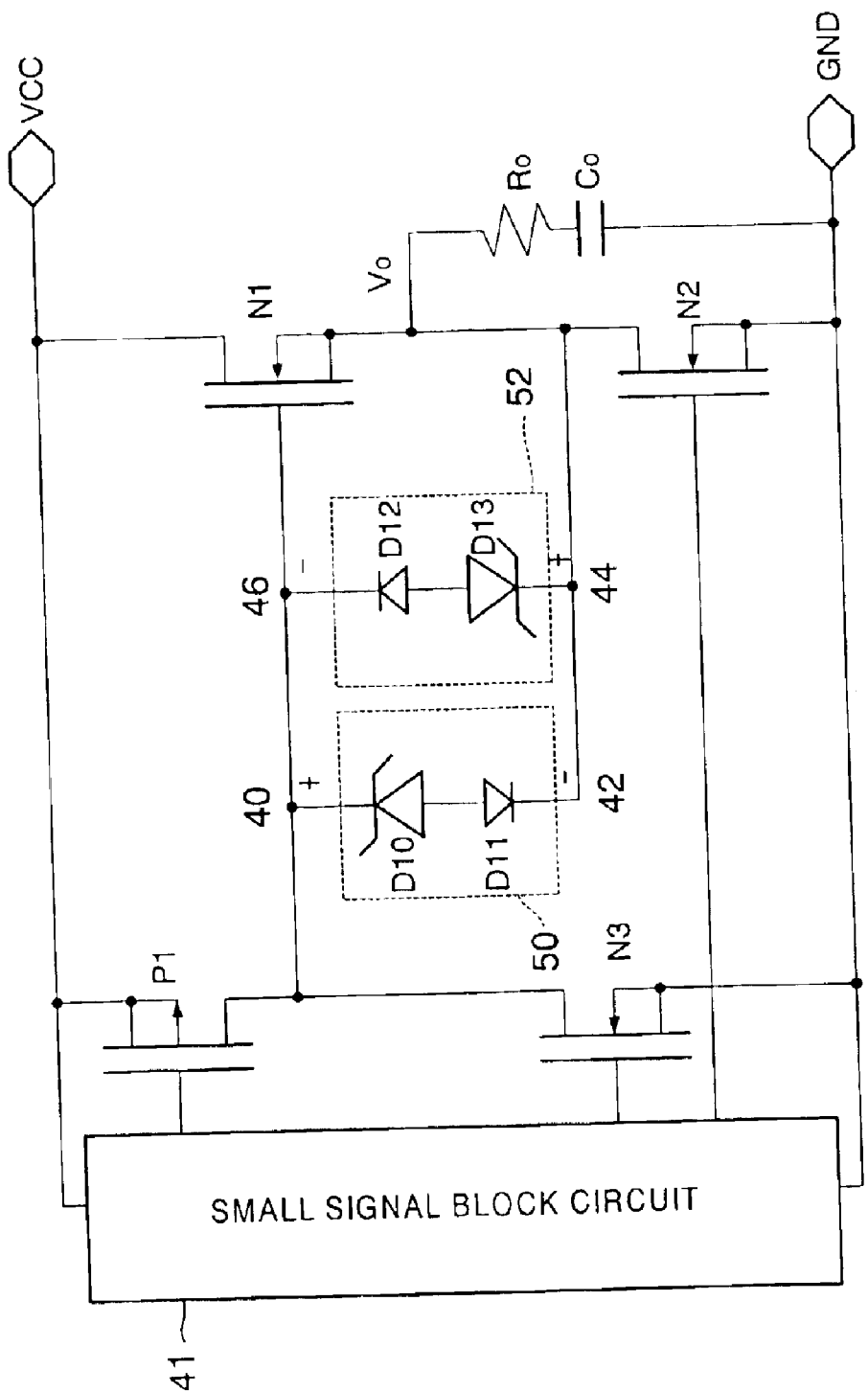
FIG. 14 is a circuit diagram showing a half-bridge circuit according to a fourth embodiment.

FIG. 14 is a diagram showing the circuit configuration of a half-bridge circuit according to this embodiment. In the half-bridge circuit in FIG. 14, a Zener diode D13 is additionally inserted in the second functional block circuit 52 according to the aforementioned third embodiment in the opposite direction to the diode D12. Namely, a cathode of the diode D12 is connected to the gate of the power MOS transistor N1. An anode of the Zener diode D13 is connected to an anode of the diode D12, and a cathode of the Zener diode D13 is connected to the source of the power MOS transistor N1.

Especially in this embodiment, the Zener diode D13 is formed of the Zener diode structured as shown in FIG. 1. The other points are the same as in the aforementioned third embodiment.

Next, the operations of these first functional block circuit 50 and second functional block circuit 52 will be explained. When the output terminal Vo is high, the first functional block circuit 50 operates, and the potential difference between the gate and the drain of the power MOS transistor N1 becomes the sum of the Zener voltage Vz of the Zener diode D10 and the base-emitter voltage VBE of the diode D11. Accordingly, if Vz+VBE is not higher than 5 V which is the gate-source voltage VGSS of the power MOS transistor N1, the gate insulating film of the power MOS transistor N1 can be protected.

In this case, the diode D12 of the second functional block circuit 52 is reverse biased, and thus it does not operate. Moreover, since the diode D12 does not operate, no current flows into the Zener diode D13, and the subcurrent which leaks to the semiconductor substrate does not flow either.

On the other hand, when the power MOS transistor P1 is turned off, the power MOS transistor N3 is turned on, the gate of the power MOS transistor N1 becomes low, and both of the power MOS transistors N1 and N2 are turned off, the output terminal Vo still remains high. Therefore, the Zener diode D13 and the diode D12 of the second functional block circuit 52 operate. Accordingly, the voltage between source and the gate of the power MOS transistor N1 becomes Vz+VBE. Consequently, if Vz+VBE is not higher than 5 V which is the gate-source voltage VGSS of the power MOS transistor N1, the gate insulating film of the power MOS transistor N1 can be protected.

In this case, the diode D11 of the first functional block circuit 50 is reverse biased, and thus it does not operate. Moreover, since the diode D11 does not operate, no current flows into the Zener diode D10, and the subcurrent which leaks to the semiconductor substrate does not flow either.

Incidentally, similarly to the aforementioned third embodiment, when the reverse withstand voltages of the diodes D11 and D12 are insufficient, it is recommended that the diodes D11 and D12 be each formed of the CB shorted LPNP transistor instead of the CB shorted NPN transistor.

Figure 15:
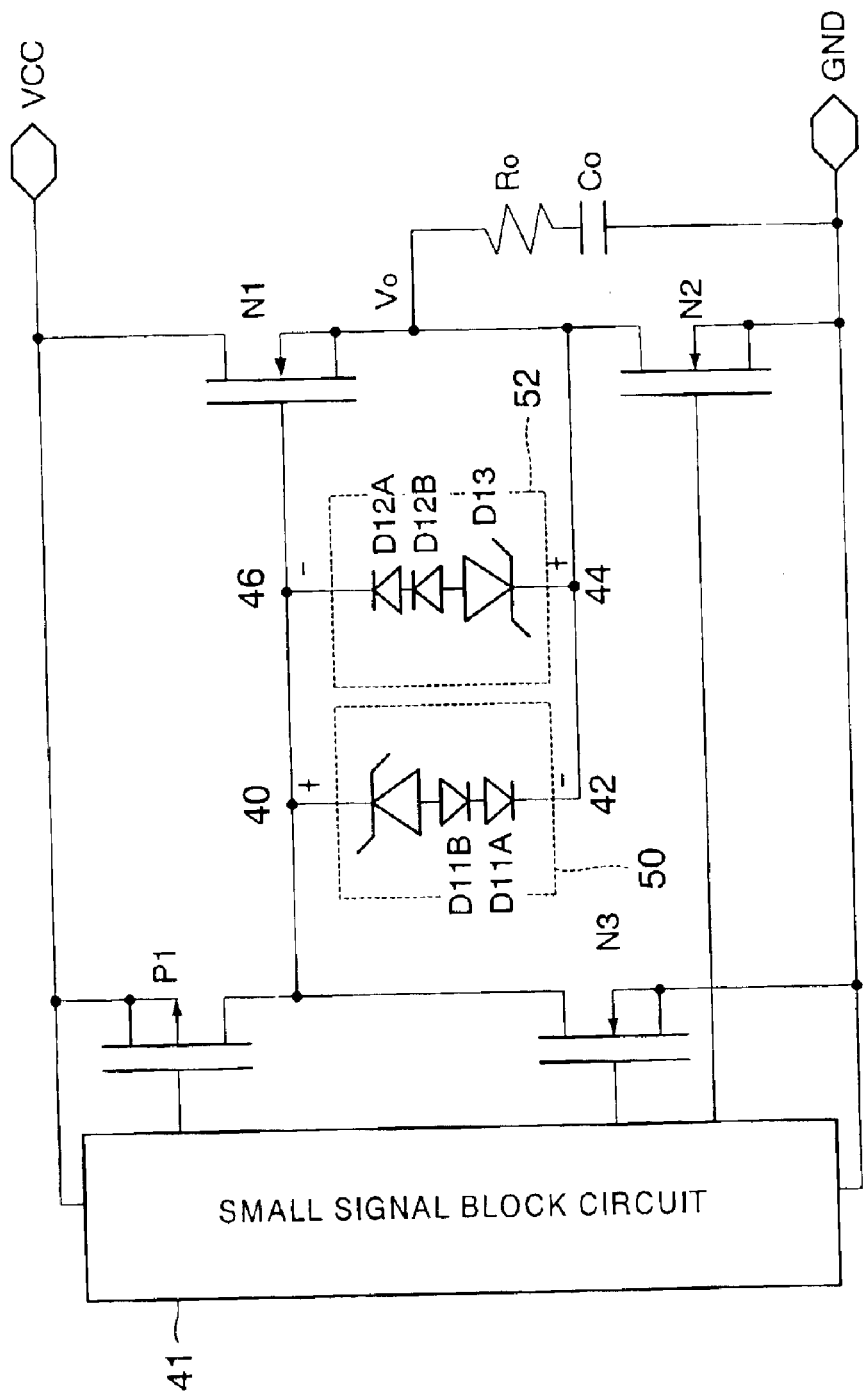
FIG. 15 is a circuit diagram showing a modification of the half-bridge circuit according to the fourth embodiment.

Moreover, when sufficient reverse with stand voltages cannot be yet obtained in the above case, it is recommended to connect a plurality of diodes constituting the first functional block circuit 50 and the second functional block circuit 52 in series. For example, as shown in FIG. 15, by providing two diodes D11A and D11B in the first functional block circuit 50 and connecting them in series in the opposite direction to the diode D10, and providing two diodes D12A and D12B in the second functional block circuit 52 and connecting them in series in the opposite direction to the diodes D11A and D11B, the reverse withstand voltages of the first functional block circuit 50 and the second functional block circuit 52 can be increased. Namely, this allows the second functional block circuit 52 not to operate while the first functional block circuit 50 operates, and contrarily allows the first functional block circuit 50 not to operate while the second functional block circuit 52 operates.

As described above, according to the half-bridge circuit according to this embodiment, the diode D12 is formed by the CB shorted NPN transistor or the CB shorted LPNP transistor, and the second functional block circuit 52 is formed of at least one diode D12, whereby the subcurrent which leaks to the semiconductor substrate can be kept to the minimum possible even when the current flows in the forward direction of the diode D12.

Consequently, it can be avoided that the subcurrent which has leaked to the semiconductor substrate changes the voltage of the ground to thereby instabilize the operation of the half-bridge circuit.

[Fifth Embodiment]

In the fifth embodiment, an example of a case where the small signal block circuit 41 in each of the aforementioned half-bridge circuits includes a photodiode.

Figure 16:
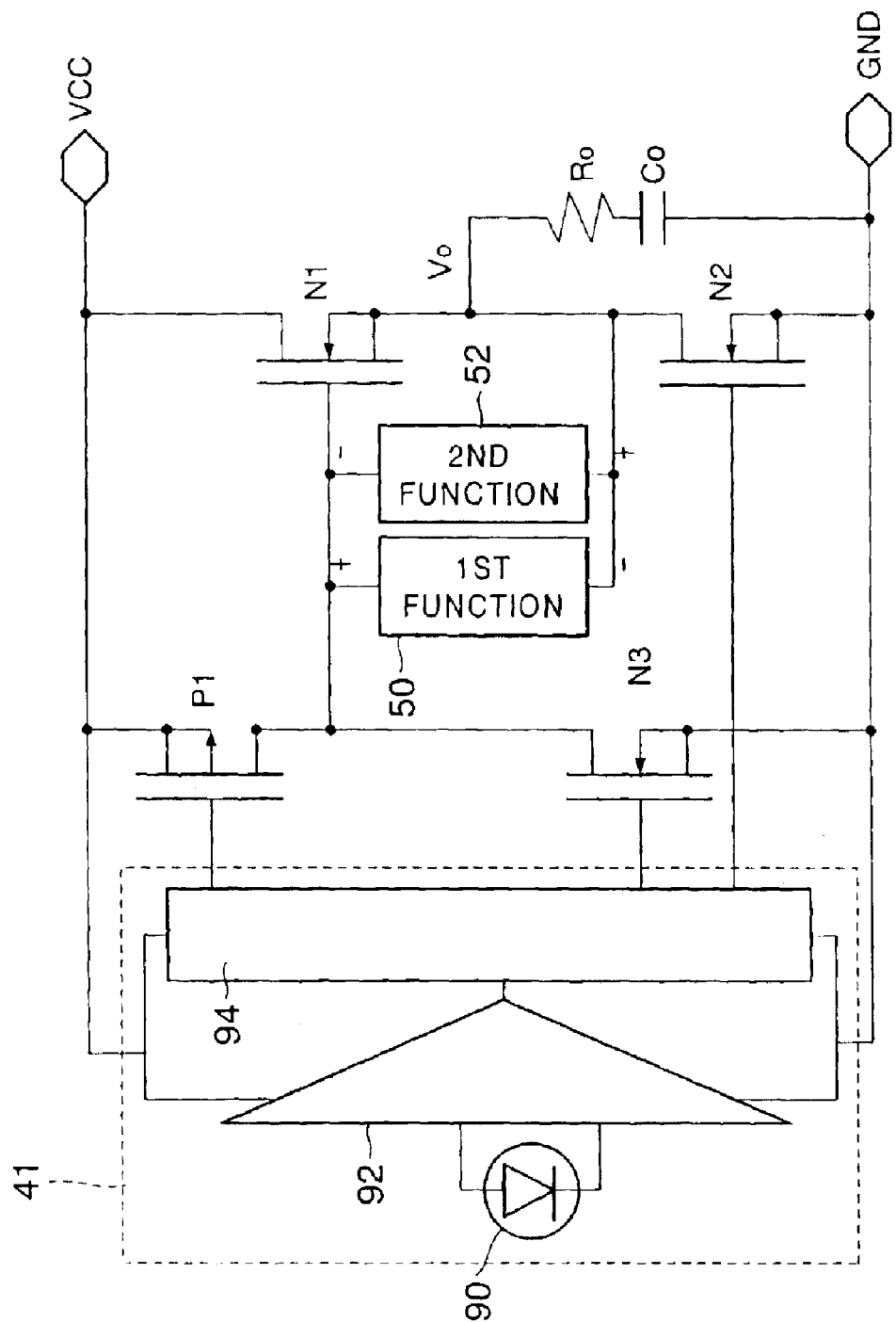
FIG. 16 is a circuit diagram of a half-bridge circuit according to a fifth embodiment.

As shown in FIG. 16, the small signal block circuit 41 according to this embodiment includes a photodiode 90, a differential amplifier 92, and a block circuit 94. When light is irradiated, the photodiode 90 reacts to this light and generates a photocurrent. Namely, the photodiode 90 is an example of a light-receiving element.

The generated photocurrent is amplified by the differential amplifier 92 and inputted to the block circuit 94. The block circuit 94 performs various circuit operations based on the amplified photocurrent and the like. For example, in this embodiment, it allows the power MOS transistor P1 and the power MOS transistor N3 to complementarily perform the on/off operations.

Points other than this is the same as in the aforementioned first to fourth embodiments. Namely, any of the configurations in the aforementioned second to fourth embodiments can be applied to the concrete configurations of the first functional block circuit 50 and the second functional circuit 52.

[Sixth Embodiment]

In the sixth embodiment, an example of a case where the photocoupler is formed using the photodiode 90 explained in the fifth embodiment.

Figure 17:
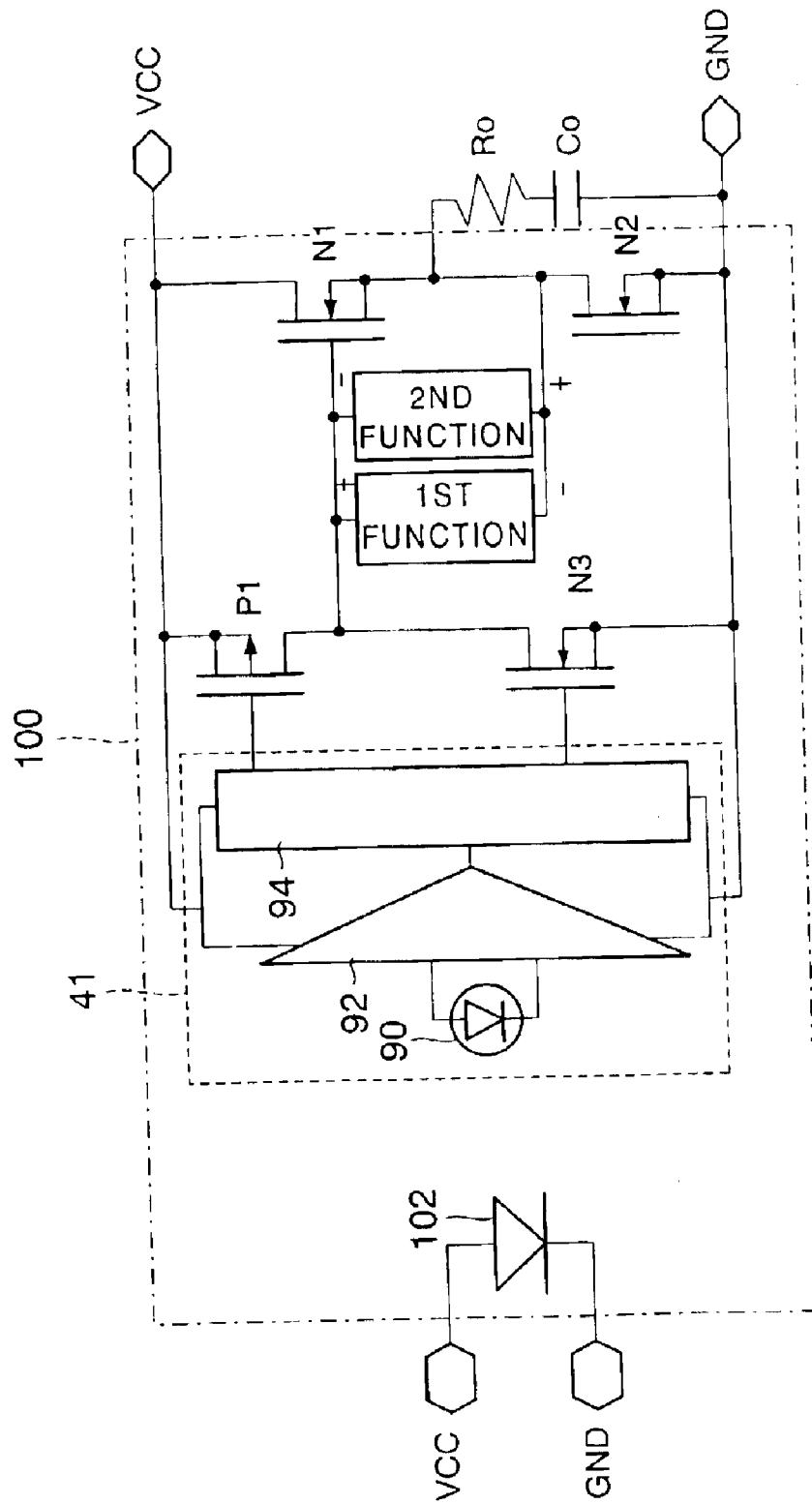
FIG. 17 is a circuit diagram showing the configuration of a photocoupler according to a sixth embodiment.

FIG. 17 is a diagram showing the configuration of a photocoupler 100 according to this embodiment. As shown in FIG. 17, the photocoupler 100 according to this embodiment is configured by adding a light-emitting diode 102 to the aforementioned fifth embodiment. Namely, when a current flows from the anode side to the cathode side of the light-emitting diode 102, the light emitting diode 102 emits light. In other words, the light-emitting diode 102 is an example of a light-emitting element. The photodiode 90 receives the light from the light-emitting diode 102 and converts it into a photocurrent. Namely, the light-emitting diode 102 and the photodiode 90 are optically coupled. The other configuration is the same as that in the fifth embodiment.

Figure 18:
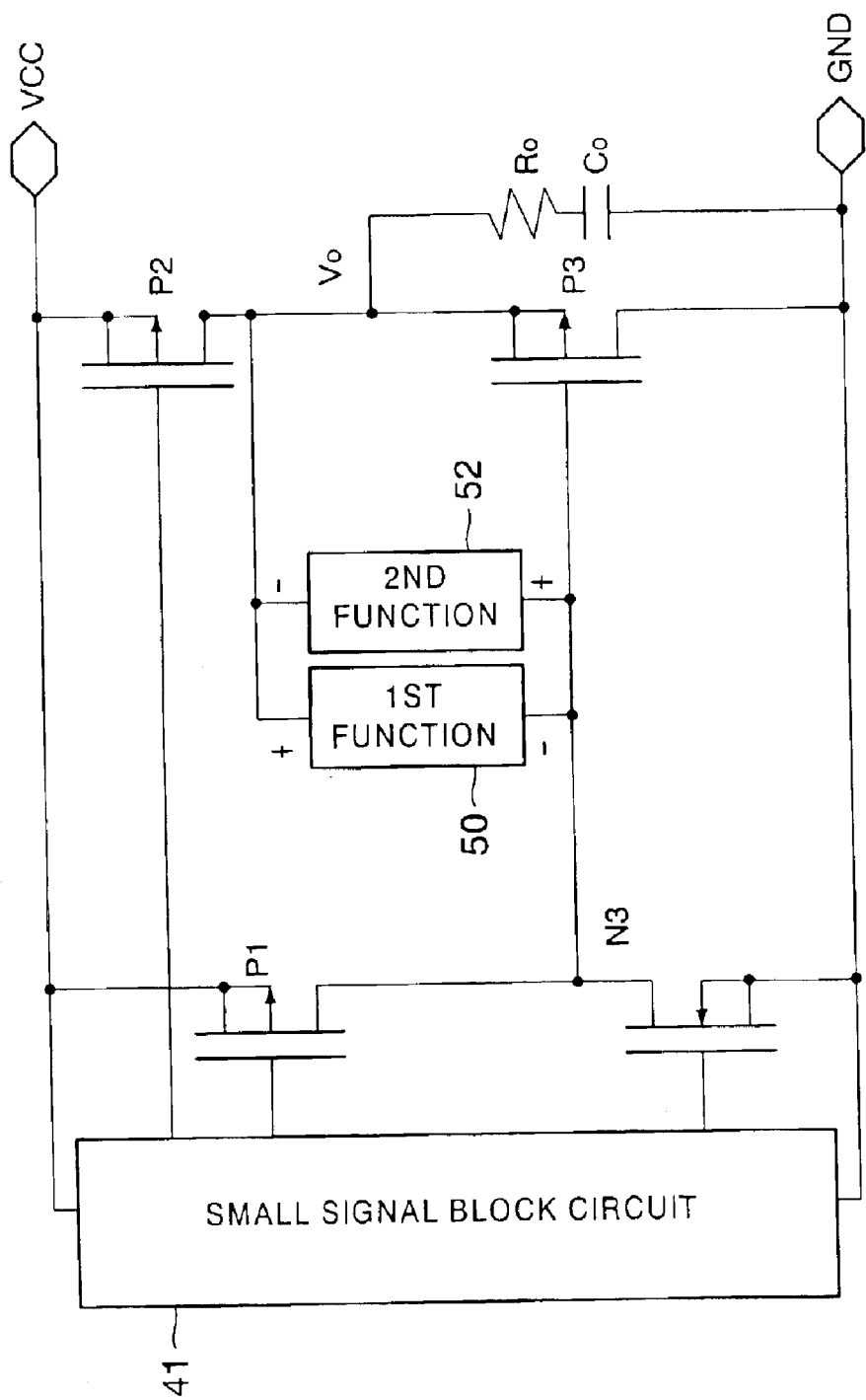
FIG. 18 is a circuit diagram of a half-bridge circuit when a power MOS transistor for output is formed of a P-type one.

It should be noted that the present invention is not intended to be limited to the aforementioned embodiments, and various changes may be made therein. For example, the case where the power MOS transistors N1 and N2 for output are N-type power MOS transistors is explained as an example in each of the aforementioned embodiments, but these power MOS transistors for output may be each formed of a P-type MOS transistor. FIG. 18 is a diagram showing an example of the configuration of a half-bridge circuit when the power MOS transistors for output are formed of P-type power MOS transistors P2 and P3. As can be seen from FIG. 18, in this case, it is suitable to insert the first functional block circuit 50 and the second functional block circuit 52, which have the aforementioned functions respectively, between the gate and the source of the lower power MOS transistor N3. In this case, the concrete circuit configurations of the first functional block circuit 50 and the second functional block circuit 52 may be any configuration in the aforementioned second to fourth embodiments. Also, the configuration in the fifth embodiment and the sixth embodiment can be applied thereto.

Figure 19:
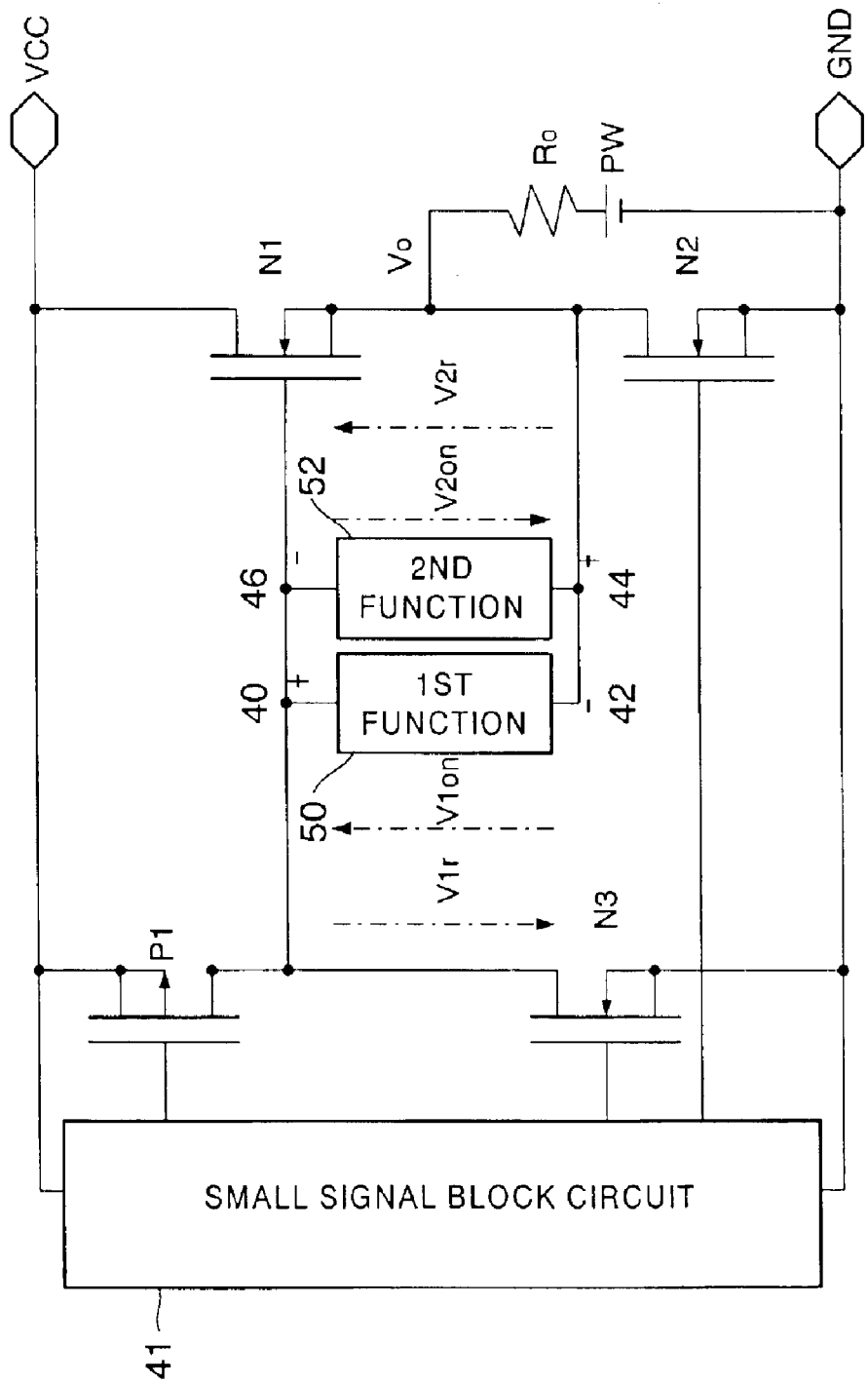
FIG. 19 is an equivalent circuit diagram when a load circuit connected to an output terminal of the half-bridge circuit may be considered as a load resistance and a power source.

Moreover, although the load circuit is equivalent to the load resistance Ro and the load capacitance Co in the aforementioned embodiments, it is not necessarily required to be equivalent to them. For example, as shown in FIG. 19, the present invention can be applied to a case where the load circuit is equivalent to the load resistance Ro and a power source PW. In the case of the example in FIG. 19, the concrete circuit configurations of the first functional block circuit 50 and the second functional block circuit 52 may be any configuration in the aforementioned second to fourth embodiments. Also, the configuration in the fifth embodiment and the sixth embodiment can be applied thereto.

Furthermore, although the present invention is explained with the half-bridge circuit as an example in the aforementioned embodiments, the application of the present invention is not limited to the half-bridge circuit, and the present invention can be applied to a semiconductor circuit which needs the protection of a gate insulating film of an MOS transistor for output.

What is claimed is:

1. A semiconductor circuit, comprising:
    a first output MOS transistor which includes a first terminal connected to a first power source and a second terminal connected to an output terminal to be connected to a load circuit;
    a second output MOS transistor which includes a third terminal connected to a second power source having a lower voltage than the first power source and a fourth terminal connected to the output terminal;
    a first functional block circuit which is connected between a control terminal of one of the first output MOS transistor and the second output MOS transistor and the output terminal, wherein the first functional block circuit includes at least one first diode, the first diode being a CB shorted NPN transistor which is formed by shorting a collector and a base of an NPN transistor and using the shorted collector and base as an anode and using an emitter as a cathode, or the first diode being a CB shorted LPNP transistor which is formed by shorting a collector and a base of a lateral PNP transistor and using the shorted collector and base as a cathode and using an emitter as an anode; and
    a second functional block circuit which is provided in parallel with the first functional block circuit and includes at least one second diode connected in an opposite direction to the first diode of the first functional block circuit, the second diode being a CB shorted NPN transistor or a CB shorted LPNP transistor.

2. The semiconductor circuit according to claim 1, wherein the first diode in the first functional block circuit is plural, and the first diodes are connected in series in the same direction.

3. The semiconductor circuit according to claim 2, wherein the second diode in the second functional block circuit is plural, and the second diodes are connected in series in the opposite direction to the first diodes.

4. The semiconductor circuit according to claim 1, wherein the first functional block circuit further comprises a first Zener diode which is connected in the opposite direction to the first diode.

5. The semiconductor circuit according to claim 4, wherein the second diode in the second functional block circuit is plural, and the second diodes are connected in series in the opposite direction to the first diode.

6. The semiconductor circuit according to claim 4, wherein the second functional block circuit further comprises a second Zener diode which is connected in the opposite direction to the second diode.

7. The semiconductor circuit according to claim 6, wherein the first diode in the first functional block circuit is plural, and the first diodes are connected in series in the same direction.

8. The semiconductor circuit according to claim 7, wherein the second diode in the second functional block circuit is plural, and the second diodes are connected in series in the opposite direction to the first diodes.

9. The semiconductor circuit according to claim 1, wherein the output terminal is connected to the load circuit which is considered as an equivalent circuit including a load capacitance or a power source.

10. The semiconductor circuit according to claim 1, wherein each of the first output MOS transistor and the second output MOS transistor is an N-type power MOS transistor.

11. The semiconductor circuit according to claim 1, further comprising a third functional block circuit which supplies a control signal to the control terminals of the first output MOS transistor and the second output MOS transistor and controls on/off state of the first output MOS transistor and the second output MOS transistor.

12. The semiconductor circuit according to claim 11, wherein the third functional block circuit comprises a photodiode.

13. A photocoupler, comprising:

a first output MOS transistor which includes a first terminal connected to a first power source and a second terminal connected to an output terminal to be connected to a load circuit;

a second output MOS transistor which includes a third terminal connected to a second power source having a lower voltage than the first power source and a fourth terminal connected to the output terminal;

a first functional block circuit which is connected between a control terminal of one of the first output MOS transistor and the second output MOS transistor and the output terminal, wherein the first functional block circuit includes at least one first diode, the first diode being a CB shorted NPN transistor which is formed by shorting a collector and a base of an NPN transistor and using the shorted collector and base as an anode and using an emitter as a cathode, or the first diode being a CB shorted LPNP transistor which is formed by shorting a collector and a base of a lateral PNP transistor and using the shorted collector and base as a cathode and using an emitter as an anode;

a second functional block circuit which is provided in parallel with the first functional block circuit and includes at least one second diode connected in an opposite direction to the first diode of the first functional block circuit, the second diode being a CB shorted NPN transistor or a CB shorted LPNP transistor;

a light-emitting element which emits light by the flow of a current; and a third functional block circuit which supplies a control signal to the control terminals of the first output MOS transistor and the second output MOS transistor and controls on/off state of the first output MOS transistor and the second output MOS transistor, wherein the third functional block circuit includes a photodiode which functions as a light-receiving element and optically couples with the light-emitting element with the photodiode.

14. The photocoupler according to claim 13, wherein the first diode in the first functional block circuit is plural, and the first diodes are connected in series in the same direction.

15. The photocoupler according to claim 14, wherein the second diode in the second functional block circuit is plural, and the second diodes are connected in series in the opposite direction to the first diodes.

16. The photocoupler according to claim 13, wherein the first functional block circuit further comprises a first Zener diode which is connected in the opposite direction to the first diode.

17. The photocoupler according to claim 16, wherein the second diode in the second functional block circuit is plural, and the second diodes are connected in series in the opposite direction to the first diode.

18. The photocoupler according to claim 16, wherein the second functional block circuit further comprises a second Zener diode which is connected in the opposite direction to the second diode.

19. The photocoupler according to claim 18, wherein the first diode in the first functional block circuit is plural, and the first diodes are connected in series in the same direction.

20. The photocoupler according to claim 19, wherein the second diode in the second functional block circuit is plural, and the second diodes are connected in series in the opposite direction to the first diodes.

21. The photocoupler according to claim 13, wherein the output terminal is connected to the load circuit which is considered as an equivalent circuit including a load capacitance or a power source.

22. The photocoupler according to claim 13, wherein each of the first output MOS transistor and the second output MOS transistor is an N-type power MOS transistor.

* * * * *